United States Patent [19]
Fujio

[11] Patent Number: 5,812,453
[45] Date of Patent: Sep. 22, 1998

[54] PROGRAMMABLE SEMICONDUCTOR MEMORY

[75] Inventor: Masuoka Fujio, Kanagawa-ken, Japan

[73] Assignee: Kabushiki Kaisha Toshiba, Kawasaki, Japan

[21] Appl. No.: 212,828

[22] Filed: Mar. 15, 1994

Related U.S. Application Data

[60] Continuation of Ser. No. 676,281, Mar. 28, 1991, Pat. No. 5,313,420, which is a division of Ser. No. 184,951, Apr. 22, 1988, abandoned.

[30] Foreign Application Priority Data

Apr. 24, 1987 [JP] Japan .................................. 62-101426
Apr. 24, 1987 [JP] Japan .................................. 62-101427

[51] Int. Cl.$^6$ .................................................. G11C 16/04
[52] U.S. Cl. ..................................... 365/185.17; 365/218
[58] Field of Search .................................. 365/104, 184, 365/185.17, 218

[56] References Cited

U.S. PATENT DOCUMENTS 4,130,900 12/1978 Watanabe .............................. 365/230.03
4,207,618 6/1980 White, Jr. et al. ....................... 365/222

(List continued on next page.)

FOREIGN PATENT DOCUMENTS

| 0 179 605 | 4/1986 | European Pat. Off. . |
| 0 283 230 | 9/1988 | European Pat. Off. . |
| 56-134390 | 10/1981 | Japan . |
| 57-71587 | 5/1982 | Japan . |
| 57-98191 | 6/1982 | Japan . |
| 59-152592 | 8/1984 | Japan . |
| 60-18262 | 9/1985 | Japan . |
| 61-184795 | 8/1986 | Japan . |
| 62-219296 | 9/1987 | Japan . |

OTHER PUBLICATIONS

Masuoka et al., "*New Ultra High Density EPROM and Flash EEPROM with NAND Structure Cell*", 1987 IEDM, Dec.1987, pp. 552–555.

Fukuda et al., "1 Mbit CMOS EPROM: HN27C101 and HN27C301", *Hitachi Review*, vol. 35, No. 5, Oct. 1986, pp. 263–266.

Stewart et al., "A High Density EPROM Cell and Array", *Symposium on VLSI Technology, Digest of Technology Papers*, May 1986, pp. 89–90.

Kupec et al., "Triple Level Polysilicon EPROM With Transistor Per Bit", *IEDM Technical Digest, International Electron Devices Meeting*, Dec. 8–10, 1980, Washington, D.C., pp. 602–606.

(List continued on next page.)

*Primary Examiner*—David C. Nelms
*Assistant Examiner*—Hoai Ho
*Attorney, Agent, or Firm*—Banner & Witcoff, Ltd.

[57] ABSTRACT

Memory cells are divided into a plurality of series circuit units arranged in matrix fashion and comprising some memory cells connected in series. The memory cells each consist of non-volatile transistors provided with a control gate electrode, a floating gate electrode and an erase gate electrode. Bit lines to which one end of each of the series circuit units of the plurality of series circuit units arranged in one row are connected in common. Column lines are provided in common for the series circuit units that are arranged in one column and that are respectively connected to each control gate electrode of the memory cells constituting each of the series circuit unit. A voltage by which the selected non-volatile transistor works in a saturation state is applied to the control gate electrode of the selected transistor of a series circuit unit by a column line, thereby injecting hot electrons from the semiconductor substrate into the floating gate electrode. Another voltage by which the non-selected non-volatile transistor works in a non-saturation operation is applied to the gate electrodes of the remaining non-volatile transistors of the series circuit unit. By sequentially selecting memory cells in one series circuit unit, the sequential data writing operation is performed. The sequential data reading operation is performed in a similar manner.

348 Claims, 15 Drawing Sheets

U.S. PATENT DOCUMENTS

| | | | |
|---|---|---|---|
| 4,233,526 | 11/1980 | Kurogi et al. | 307/238 |
| 4,344,156 | 8/1982 | Eaton, Jr. et al. | 365/203 |
| 4,371,956 | 2/1983 | Maeda et al. | 365/185.21 |
| 4,377,857 | 3/1983 | Tickle | 365/185 |
| 4,384,349 | 5/1983 | McElroy | 365/218 |
| 4,437,172 | 3/1984 | Masuoka | 365/182 |
| 4,437,174 | 3/1984 | Masuoka | 365/218 |
| 4,467,453 | 8/1984 | Chiu et al. | 365/185.16 |
| 4,480,320 | 10/1984 | Naiff | 365/104 |
| 4,533,843 | 8/1985 | McAlexander, III et al. | 327/57 |
| 4,580,247 | 4/1986 | Adam | 365/200 |
| 4,639,892 | 1/1987 | Mizugaki et al. | 365/182 |
| 4,648,074 | 3/1987 | Pollachek | 365/184 |
| 4,694,427 | 9/1987 | Miyamoto et al. | 365/185.23 |
| 4,694,431 | 9/1987 | Miyamura et al. | 365/104 |
| 4,698,787 | 10/1987 | Mukherjee et al. | 365/104 |
| 4,742,491 | 5/1988 | Liang et al. | 365/218 |
| 4,763,305 | 8/1988 | Kuo | 365/200 |
| 4,855,954 | 8/1989 | Turner et al. | 365/185.17 |
| 4,933,904 | 6/1990 | Stewart et al. | 365/195 |

OTHER PUBLICATIONS

Adler, "Densely Arrayed EEPROM Having Low–Voltage Tunnel Write", *IBM Technical Disclosure Bulletin*, vol. 27, No. 6 Nov. 1984, pp. 3302–3307.

Kotecha, "Electrically Alterable Non–volatile Logic Circuits", *IBM Technical Disclosure Bulletin*, vol. 24, No. 7B, Dec. 1981, pp. 3811–3812.

Cioaca et al., "A Million–Cycle CMOS 256K EEPROM", *1987 IEEE International Solid State Circuits Conference, Digest of Technical Papers*, Feb. 25–27, 1987, pp. 78–79.

Samachisa et al., "A 128K Flash EEPROM Using Double Polysilicon Technology", *1987 IEEE International Solid State Circuits Conference, Digest of Technical Papers*, Feb. 25–27, 1987, pp. 76–77.

| SELECTOR | INPUT | | |
|---|---|---|---|
| RD1 | A1 | A2 | A3 |
| RD2 | $\overline{A1}$ | A2 | A3 |
| RD3 | A1 | $\overline{A2}$ | A3 |
| RD4 | A1 | A2 | $\overline{A3}$ |
| RD5 | A1 | $\overline{A2}$ | $\overline{A3}$ |
| RD6 | $\overline{A1}$ | $\overline{A2}$ | A3 |
| RD7 | $\overline{A1}$ | A2 | $\overline{A3}$ |
| RD8 | $\overline{A1}$ | $\overline{A2}$ | $\overline{A3}$ |

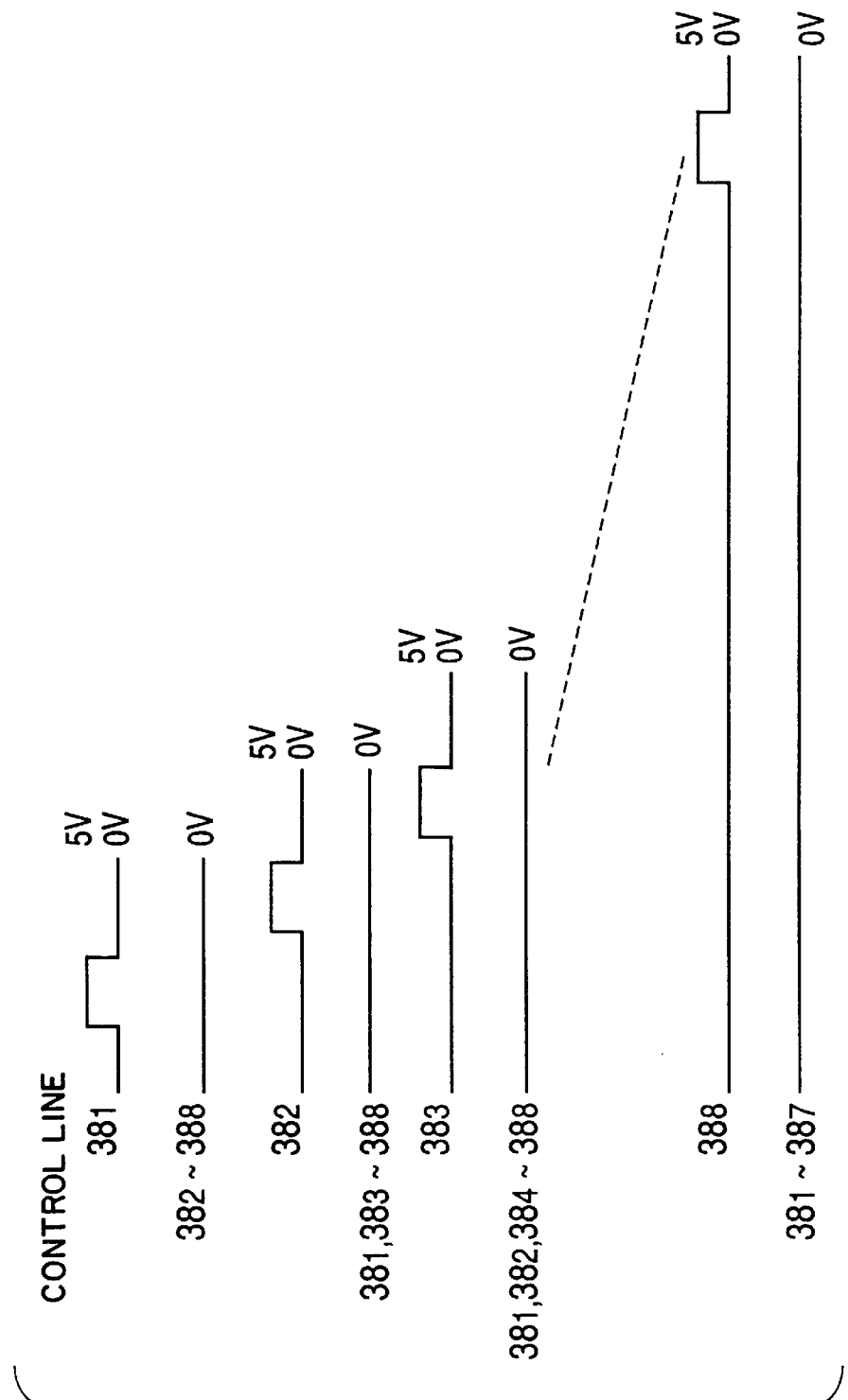

PROGRAMMABLE SEMICONDUCTOR MEMORY

This application is a continuation of application Ser. No. 07/676,281, filed Mar. 28, 1991, now U.S. Pat. No. 5,313, 420, which is a division of application Ser. No. 07/184,951 filed Apr. 22, 1988, now abandoned.

This application is related by subject matter to a commonly assigned application entitled "Programmable Semiconductor Memory" filed concurrently herewith.

BACKGROUND OF THE INVENTION

1. Field of the Invention

This invention relates to a programmable semiconductor memory using non-volatile transistors as memory cells from which data can be electrically erased. It particularly relates to a non-volatile semiconductor memory in which data stored in a plurality of memory cells may be erased simultaneously, in units of a block, or in units of a column. Data may be written to the memory a cell (or bit) at a time.

2. Description of the Prior Art

A non-volatile transistor memory which permits erasure of data is known as an EPROM (Erasable and Programmable Read Only Memory). An EPROM from which data may be erased electrically is called an $E^2$ PROM (Electrically Erasable PROM). $E^2$ PROMs have been developed which permit the simultaneous erasure of data stored in a plurality of memory cells. Such an $E^2$ PROM is disclosed in "A 128K Flash EEPROM Using Double Polysilicon Technology", pp. 76–77 of "1987 IEEE International Solid State Circuits Conference, Digest of Technical Papers."

FIG. 11 is a circuit diagram depicting a conventional $E^2$ PROM memory cell array using the cells described in the above-mentioned document. In this Figure, memory cells 90 consist of non-volatile transistors having a floating gate electrode and a control gate electrode. Data erasure may be effected electrically. Memory cells 90 are arranged in a row and column matrix. The drains of each memory cell 90 in a given row of memory cells (which are horizontal as seen in the drawing) are respectively coupled to the same one of bit lines 91. The sources of the memory cells 90 in a given row of memory cells are respectively coupled to the same one of ground lines 92. The control gate electrodes of the memory cells 90 in a given column of memory cells (which are vertical as seen in the drawing) are respectively coupled to the same one of column lines 93. In this memory, data may be read or written by the selective imposition of set voltages on a given bit line 91 and column line 93 to select a particular 1-bit cell. Block data erasure of all the bits can be effected by the simultaneous imposition of a set voltage on all the bit lines 91.

This memory permits large-scale integration of cells since each cell or bit consists of a single non-volatile transistor. However, data erasure may only be effected in the cells simultaneously or in units of a row. It is not possible to effect data erasure in units of a byte, the processing unit for parallel read/write memories.

The prior art does disclose an $E^2$ PROM which permits data erasure in byte units. Reference is made, for example to "A Million-cycle CMOS 256K EEPROM", pp. 78–79 of "1987 IEEE International Solid-State Circuits Conference, Digest of Technical Papers." However, large-scale integration of cells is not possible with the memory disclosed therein, since each 1-bit memory cell comprises two or four transistors.

SUMMARY OF THE INVENTION

It is therefore an object of the present invention to provide a device to control the operations of a programmable semiconductor memory wherein the reading, writing and electrical erasure of data is effected in 8 bit (1 byte) units.

Another object of this invention is to provide a programmable semiconductor memory wherein a high integration density can be achieved by reducing the number of wires and the number of contacts.

Another object of this invention is to provide a programmable semiconductor memory wherein the reading, writing, and electrical erasure of data in 8 bit (1 byte) units can be achieved.

Yet another object of this invention is to provide a programmable semiconductor memory with high integration density wherein the electrical data erasure is made in byte units.

A further object of this invention is to provide a programmable semiconductor memory whose manufacturing cost is low.

The non-volatile semiconductor memory of this invention comprises a series circuit unit having at least two memory cells connected in series. Each memory cell consists of a non-volatile transistor having a floating gate electrode, a control gate electrode, and an erase gate electrode. Data stored in the memory cells may be erased electrically.

One end of each of the series circuit units in a given column is coupled to a common bit line. The erase gate electrodes of the memory cells in a given series circuit unit are commonly connected. The control gate electrodes of the memory cells in a given row of memory cells are coupled to a common row line. An erase line is provided on which an erase voltage is imposed at times of data erasure. Also included is means for imposing a set voltage on the bit lines and row lines to sequentially read or write data in the memory cells comprising a series circuit unit.

The present invention also concerns an address selector for use with a programmable memory having a plurality of memory cells. The address selector has means for sequentially selecting the memory cells in a predetermined fashion. The data is transferred along data lines coupled to the memory cells and a plurality of temporary storage cells. The temporary storage cells are controlled by address data to select one of the temporary storage cells for reading data from the memory cells and writing data into the memory cells.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein:

FIGS. 8A and 8B are timing charts associated with writing data to the $E^2$ PROM depicted in FIG. 1.

DETAILED DESCRIPTION OF THE PREFERRED EMBODIMENT

Figure 12:
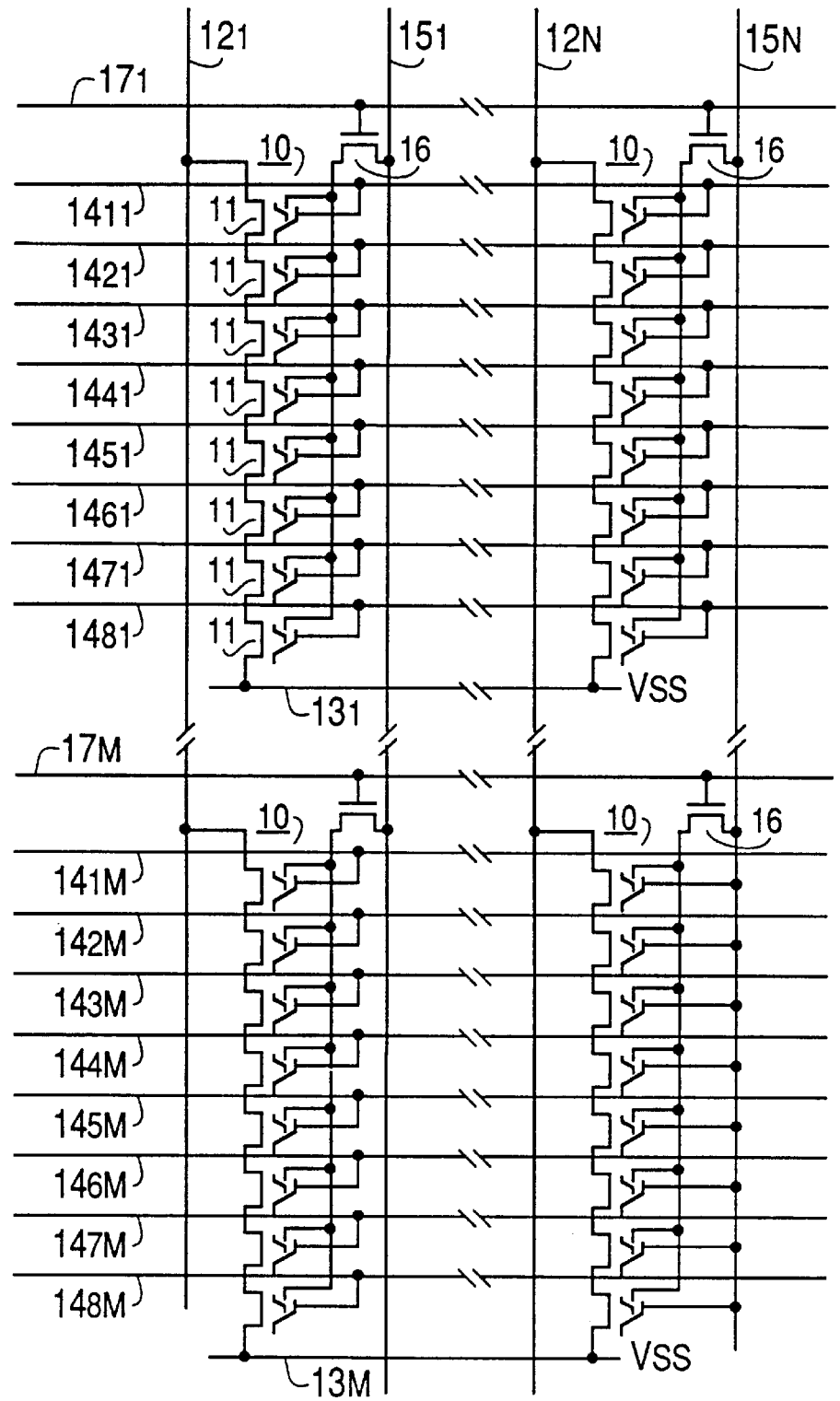
FIG. 12 is the circuit diagram of FIG. 1 without the associated peripheral circuitry.

FIG. 12 is a circuit diagram of a memory cell array portion in which the present invention is applied to an $E^2$ PROM (referred to below simply as a "memory"). In the drawing, series circuit units 10 each include eight memory cells 11 connected in series. Each memory cell 11 in each series circuit unit 10 includes a non-volatile transistor having: a source region; a drain region; a floating gate electrode provided in the channel region between the source and drain regions; an erase gate electrode; and a control gate electrode, the latter two gate electrodes arranged so as to overlap the floating gate electrode.

Generally, the present invention may be applied to what may be termed programmable memories. Programmable memory as used herein refers to any kind of semiconductor memory which can be programmed before, during, or after fabrication or manufacture. It may include, but should not be limited to, non-volatile memories, MASKROMs, SRAMS, and DRAMs.

A plurality of these series circuit units 10 are arranged in a matrix fashion. The series circuit units are disposed in rows and columns. As used herein "row" refers to that which extends horizontally or from left to right as viewed in FIG. 12. "Column" refers to that which extends vertically or from top to bottom as viewed in FIG. 12. For clarity in the subsequent discussion, it should be noted that each row of series circuit units in FIG. 12 includes eight rows of memory cells, the control gates of the memory cells disposed in a given row of memory cells being coupled to the same one of row lines 14. Although these terms have been defined for clarity of description, they should not be read to limit in any way the scope of the invention, but rather to facilitate understanding.

Each series circuit unit 10 has one end coupled to one of bit lines $12_1, \ldots 12_N$, with each of the series circuit units in a given column of series circuit units being coupled to the same bit line. The other end of each series circuit unit 10 is coupled to one of ground lines $13_1, \ldots 13_M$, with each of the series circuit units in a given row of series circuit units being coupled to the same ground line. A potential difference of 0 V is maintained across each of the ground lines 13. The control gate electrodes of each of the eight memory cells 11 in a series circuit unit 10 are coupled to a respective one of row lines 14. Each row of series circuit units has associated with it eight row lines $14_1 \ldots 14_8$, with the memory cells in a given row of memory cells being coupled to the same row line. In each series circuit unit 10, the erase gate electrodes of the eight memory cells 11 are connected to each other. These connected erase gate electrodes are coupled to one of erase lines $15_1, \ldots 15N$ through a switching transistor 16. The series circuit units in a given column of series circuit units are coupled to the same erase line through switching transistors, a single switching transistor being provided for each series circuit unit. The control gate electrodes of the switching transistors 16 are coupled to one of erase selection lines $17_1, \ldots 17_M$, with the control gate electrodes of the switching transistors in a given row of series circuit units being coupled to the same erase selection line.

Figure 13:
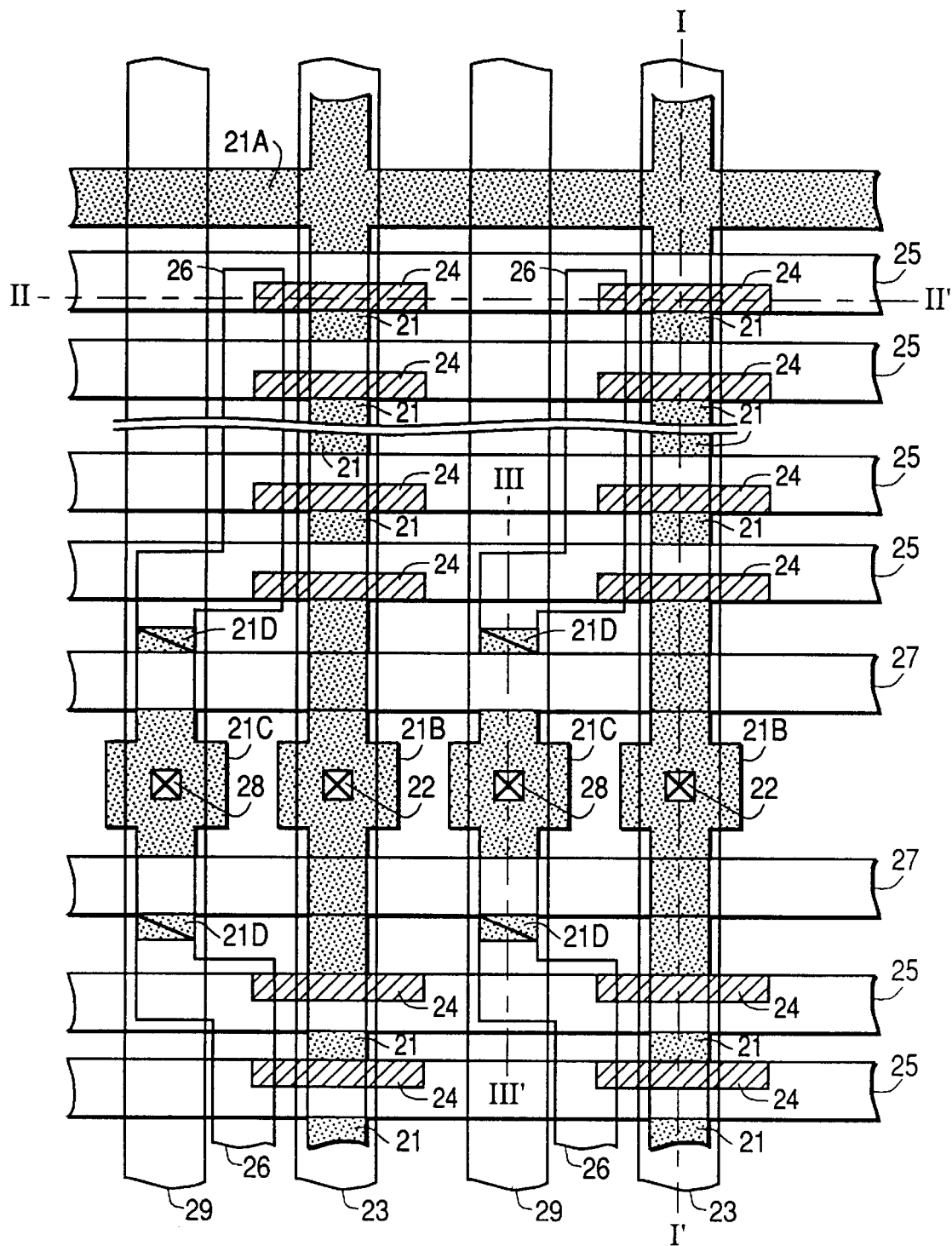
FIG. 13 is a plan view of a pattern showing the memory cell array of the circuit diagram corresponding to FIG. 12.
Figure 14:
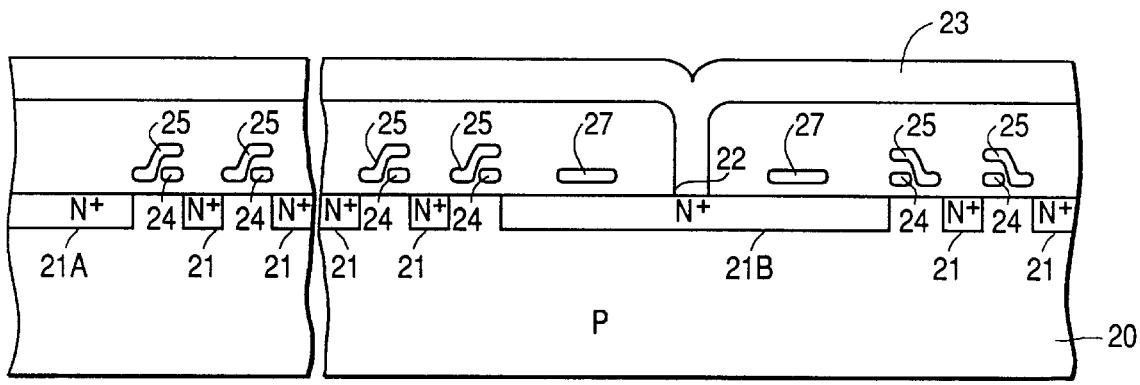
FIGS. 14, 15 and 16 are cross-sectional views taken along lines I—I', II—II', and III—III' of FIG. 13 respectively.
Figure 15:
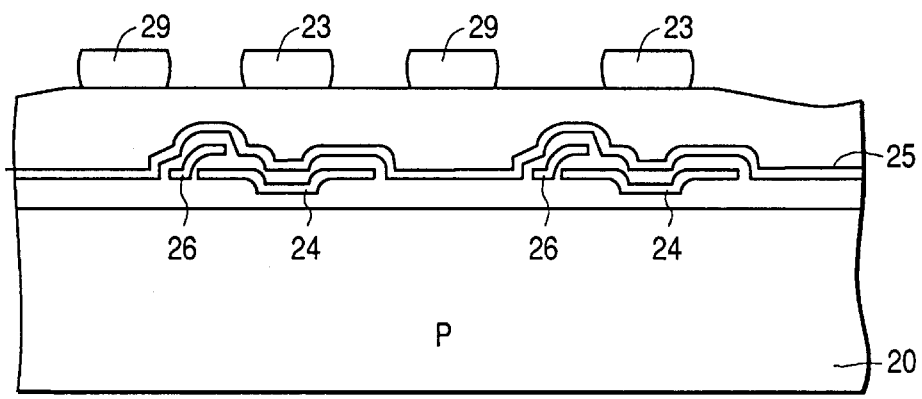
Figure 16:
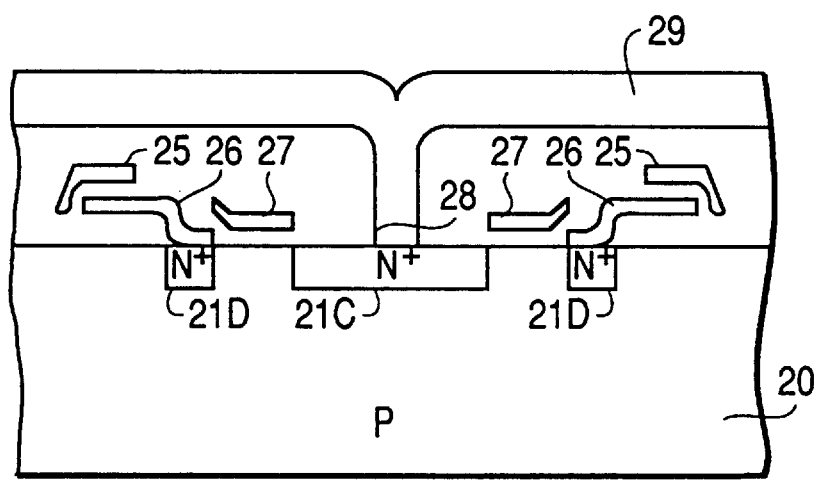

FIG. 13 is a plan view corresponding to the structure of the memory cell array circuit shown in FIG. 12 when such a memory is actually provided on a semiconductor chip. FIG. 14 is a cross-sectional view along the line I—I' in FIG. 13. FIG. 15 is a cross-sectional view along the line II—II' in FIG. 13. FIG. 16 is a cross-sectional view along the line III—III' in FIG. 13.

A P-type silicon semiconductor substrate is used as the substrate 20 in the memory of this embodiment. Separate N+ type regions 21, providing the source and drain regions of the eight memory cells 11 in each series circuit unit 10, are formed in the surface region of the substrate 20. N+ regions 21A and 21B, positioned in the uppermost and central portions of FIG. 13 respectively, are common to neighboring series circuit units 10. N+ region 21A serves as a ground line 13. Metal leads 23, made for example of aluminum, are connected to N+ regions 21B through contact holes 22 and serve as the bit lines 12. Electrodes 24, made of a first polycrystalline silicon layer and put in a floating electrical state, are formed between adjacent N+ regions 21, insulated therefrom by an insulating layer. Electrodes 24 are the floating gate electrodes of the various memory cells 11. Electrodes 25, made of a third polycrystalline silicon layer, are formed over the sets of electrodes 24 that are disposed horizontally in FIG. 13, insulated therefrom by an insulating layer. Electrodes 25 are the control gate electrodes of the memory cell 11 and serve as the column lines 14. Electrodes 26, made of a second polycrystalline silicon layer, are formed between adjacent series circuits disposed in different columns, and partially overlap electrodes 24, insulated therefrom by an insulating layer. Electrodes 26 are the common erase gate electrodes of the various memory cells 11 in the series circuit units.

N+ regions 21C are formed between adjacent N+ regions 21B. A pair of N+ regions 21D are also formed separate from N+ regions 21C. N+ regions 21C and 21D are the source and drain regions of switching transistor 16. Electrodes 27, made of the third polycrystalline silicon layer, are formed between these source and drain regions, insulated therefrom by an insulating layer. Electrodes 27 are the control gate electrodes of transistors 16 and serve as the erase selection lines 17. Electrodes 26, the common erase gate electrodes, are connected to N+ regions 21D via a direct contact portion and metal leads 29, of, for example, aluminum, are connected to N+ regions 21C via contact holes 28. Metal leads 29 serve as erase lines 15.

Thus, the memory is a matrix of series circuit units 10, each of which comprises eight series connected memory cells 11. One end each of each series circuit unit 10 is connected to a bit line 12, embodied in metal lead 23, and the other end is connected to a ground line 13, embodied in N+ region 21A. The control gate electrodes of the various memory cells 11 are connected to row lines 14, embodied in electrodes 25. The erase gate electrodes of each memory cell in a series circuit unit are commonly connected and coupled to erase lines 15 via transistors 16. The conduction of transistors 16 is controlled by signals from the corresponding erase selection line 17.

Figure 1:
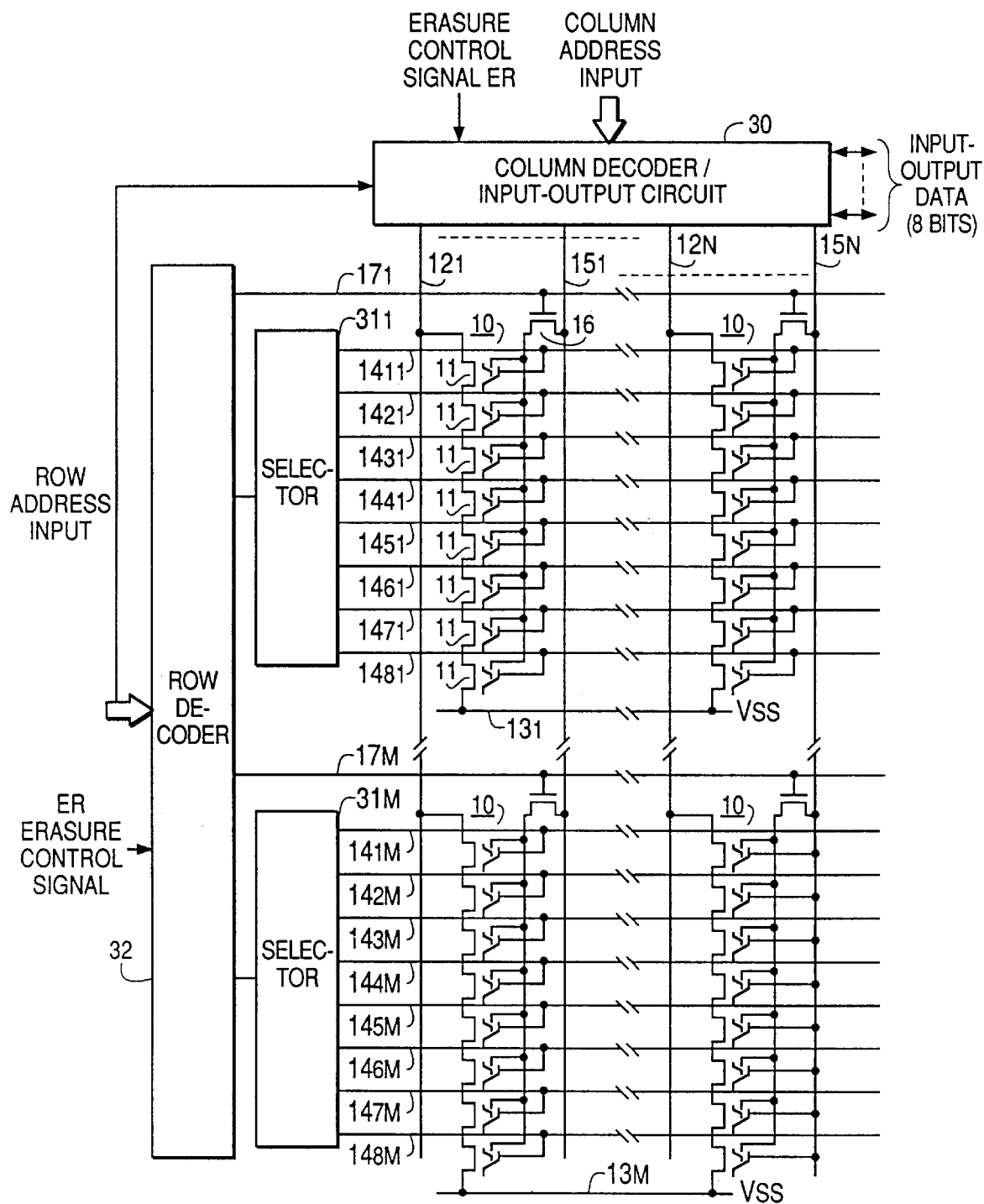
FIG. 1 is a circuit diagram showing the entire configuration, including peripheral circuitry, of an $E^2$ PROM according to the present invention.

FIG. 1 is a diagram showing the overall configuration of an $E^2$ PROM according to one embodiment of the present invention. N bit lines 12 and N erase lines 15 are coupled to column decoder/input-output circuit 30 to which an erase control signal ER and a column address input are input. Parts of the row address inputs, discussed later, are input to column decoder/input-output circuit 30, and 8-bit input/output data is input to and output from circuit 30. The detailed configuration of column decoder/input-output circuit 30 will be described below.

Eight row lines 14 are coupled to each of the series circuit unit selectors $31_1$ to $31_M$. Series circuit unit selectors 31 and M erase selection lines 17 are coupled to row decoder 32, to which row address input and erase control signal ER are input. Row decoder 32 outputs a selection signal to one series circuit unit selector 31 in response to a row address input, and selectively outputs a high voltage to one of M erase selection lines 17 in response to row address input during data erasure.

Figure 2:
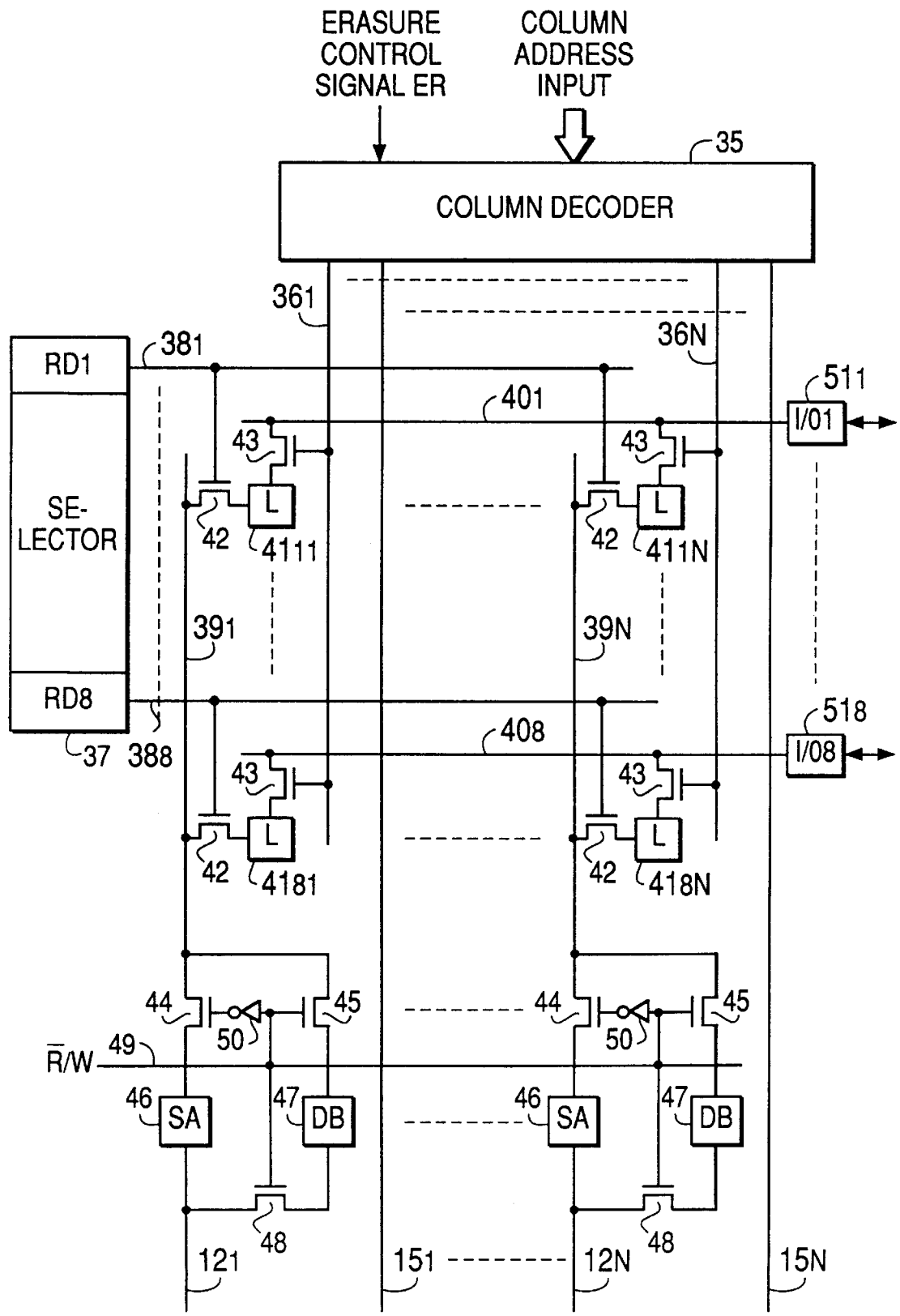
FIG. 2 is a circuit diagram showing the detailed configuration of the column decoder/input-output circuit depicted in FIG. 1.

FIG. 2 is a circuit diagram showing the internal configuration of column decoder/input-output circuit 30. In FIG. 2, reference numeral 35 denotes a column decoder to which a column address input and an erase control signal ER are input. Erase lines $15_1$ to $15_N$ and control lines $36_1$ to $36_N$ are coupled to column decoder 35. Column decoder 35 selects one of control lines $36_1$ to $36_N$ in response to the column address input during data writing and data reading and outputs a high voltage thereto. Decoder 35 selects one of erase lines $15_1$ to $15_N$ during data erasure and similarly outputs a high voltage thereto.

Reference numeral 37 denotes a selector, to which parts of the row address inputs (e.g., 3-bit addresses $A_1, A_2, A_3$) are input. Selector 37 has eight partial selectors RD1–RD8 and selects one of control lines $38_1$ to $38_N$ according to an input address, setting it to a high potential.

Reference numerals $39_1$ to $39_N$ denote first data lines, and reference numerals $40_1$ to $40_8$ denote second data lines. Latch circuits $41_{11}, \ldots, 41_{1N}$ to $41_{81}, \ldots, 41_{8N}$ for latching 1-bit data are provided at the respective intersections of the first and second data lines. The eight latch circuits disposed in a given column are coupled to the same first data line 39 through respective data transfer MOS transistors 42, a single transistor 42 being associated with each latch circuit 41. The N latch circuits disposed in a given row are coupled to the same second data line 40 through respective data transfer MOS transistors 43, a single transistor 43 being associated with each latch circuit 41. The gates of the N transistors 42 disposed in the same row are coupled to the corresponding one of control lines $38_1$ to $38_8$ and the gates of the eight transistors 43 disposed in the same column are coupled to the corresponding one of control lines $36_1$ to $36_N$.

Associated with each first data line 39 are two additional data transfer MOS transistors 44, 45. One terminal of both transistors 44, 45 is coupled to the associated data line 39. The remaining terminal of transistor 44 is coupled to the corresponding one of the bit lines $12_1$ to $12_N$ through a sense amplifier 46 while the remaining terminal of transistor 45 is coupled to the corresponding bit line through data input buffer (DB) 47 and data transfer MOS transistor 48, respectively. The gates of MOS transistors 45, 48 are coupled to control line 49, to which a read/write control signal R/W, set to a low potential during data reading and to a high potential during data writing is applied. The gates of MOS transistors 44 are coupled to control line 49 through inverters 50, respectively. Data input/output circuits (I/01 to I/08) $51_1$ to $51_8$ are coupled to second data lines $40_1$ to $40_8$, respectively.

In the column decoder/input-output circuit 30 configured as described above, eight latch circuits 41 are provided for each of the N bit lines 12. A sense amplifier 46 and a data input buffer (DB) 47 are also provided for each bit line 12. The MOS transistors are all N-type.

Figure 3:
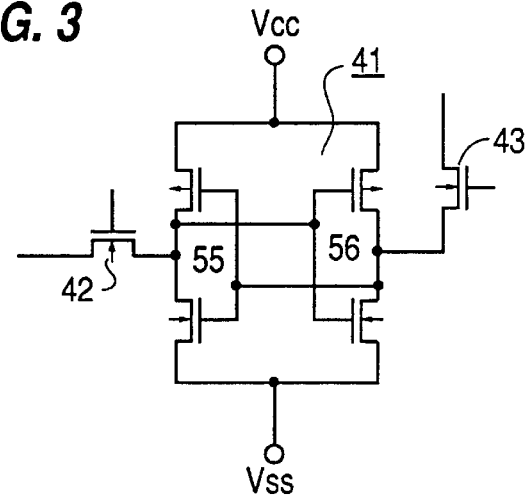
FIG. 3 is a circuit diagram showing the detailed configuration of the latch circuit depicted in FIG. 2.

FIG. 3 is a circuit diagram showing the detailed configuration of a latch circuit 41 schematically shown in FIG. 2. Latch circuit 41 is formed by cross-connecting the input and the output terminals of two CMOS inverters 55 and 56, each inverter having P-type and N-type MOS transistors. One terminal of the data transfer MOS transistors 42 is coupled to the output terminal of inverters 55 and one terminal of data transfer MOS transistors 43 is coupled to the output terminal of inverters 56.

Figure 4:
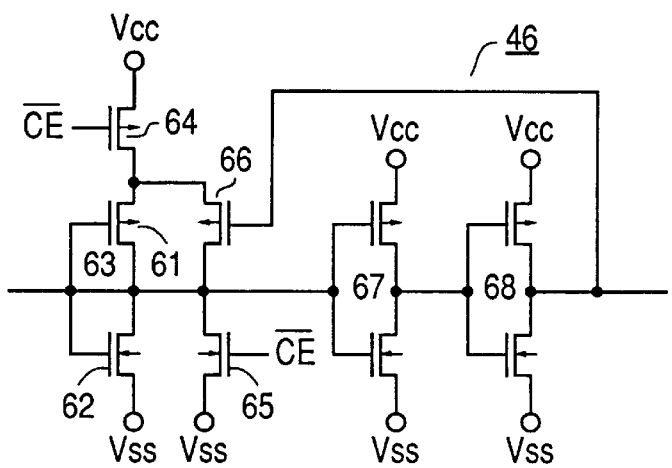
FIG. 4 is a circuit diagram showing the detailed configuration of the sense amplifier depicted in FIG. 2.

FIG. 4 is a circuit diagram showing the detailed configuration of sense amplifier 46 schematically shown in FIG. 2. Sense amplifier 46 may be activated by a chip enable control signal CE and includes a CMOS inverter 63 having a P-type MOS transistor 61 and an N-type MOS transistor 62 arranged such that the input and output terminals of the inverter are shortcircuited. P-type MOS transistor 64 is coupled between inverter 63 and power source Vcc and chip enable control signal CE is input to the gate thereof. N-channel MOS transistor 65 is coupled between the output terminal of CMOS inverter 63 and reference power source Vss and chip enable control signal CE is input to the gate thereof. P-type MOS transistor 66 is coupled between the output of CMOS inverter 63 and a junction between inverter 63 and MOS transistor 64. Two CMOS inverters 67, 68 are coupled in cascade to the output of inverter 63. The output of inverter 68 is transmitted as a sense amplifier output to corresponding data line 39 through MOS transistor 44 (FIG. 2), and is also fed back to the gate of MOS transistor 66.

The sense amplifier configured as described above is activated in such a manner that transistor 64 is turned on and transistor 65 is turned off when chip enable control signal CE is set to a low-level potential in order to amplify the potential of corresponding bit line 12. Since the input and output terminals of CMOS inverter 63 are shortcircuited, its input terminal potential, i.e., the bit line potential is set, for example, to 1 V when Vcc is, for example, 5 V.

Figure 5:
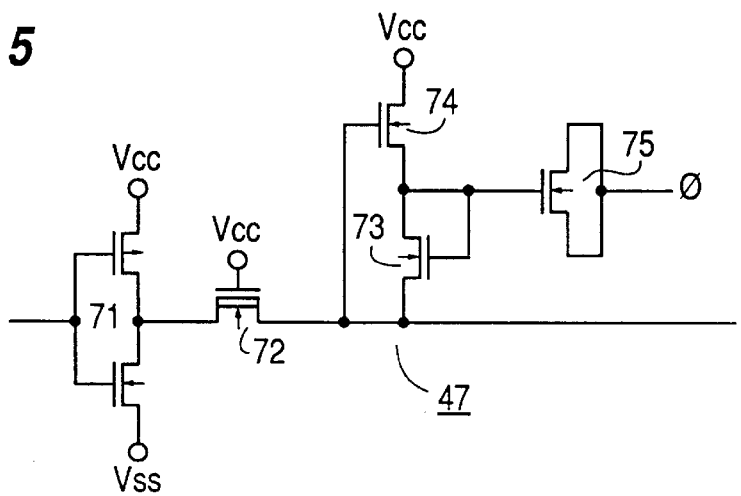
FIG. 5 is a circuit diagram showing the detailed configuration of the data input buffer depicted in FIG. 2.

FIG. 5 is a circuit diagram showing the detailed configuration of the data input buffer 47 schematically shown in FIG. 2. Data input buffer 47 includes a CMOS inverter 71 and a depression type N-type MOS transistor 72, the first terminal of which is coupled to the output terminal of inverter 71. The voltage Vcc is applied to the gate of transistor 72. Two N-type MOS transistors 73, 74 are coupled in series between the second terminal of MOS transistor 72 and power source Vcc. N-type MOS transistor 75 is arranged such that its source and drain terminals are coupled together. A pulse signal 0 is input thereto to substantially produce a capacitor-like operation. The gates of transistors 73 and 75 are coupled to a junction between series-coupled transistors 73 and 74. The gate of transistor 74 is connected to the second terminal of MOS transistor 72. The data input buffer constructed as described above has a voltage rising function using a pulse signal.

Figures 6, 7:
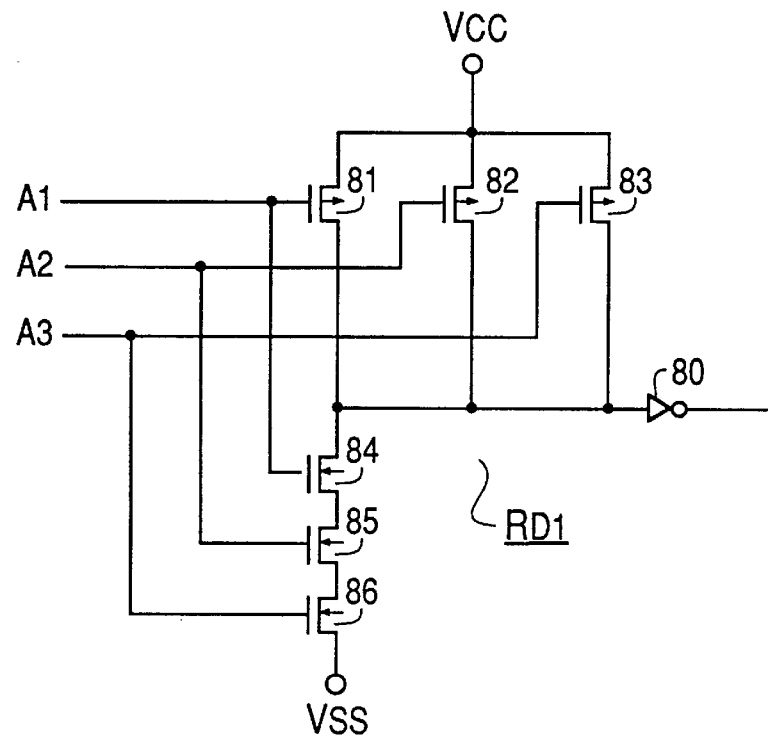
FIG. 6 is a circuit diagram showing the detailed configuration of a portion of the selector circuit depicted in FIG. 2.
FIG. 7 is a table showing the address inputs to the partial selectors of the selector circuit depicted in FIG. 2.

FIG. 6 is a circuit diagram showing the detailed configuration of partial selector RD1 of them partial selectors of selector 37 schematically shown in FIG. 2. Partial selector RD1 has three P-type MOS transistors 81, 82, 83 coupled in parallel between power source Vcc and the input terminal of inverter 80. Three N-type MOS transistors 84, 85, 86 are coupled in series between the input terminal of inverter 80 and reference power source Vss. Bit A1 of the 3-bit row address input is input to the gates of transistors 81 and 84, A2 is input to the gates of transistors 82 and 85, and A3 is input to the gates of transistors 83 and 86. In partial selector RD1 constructed as described above, when the 3-bit address inputs A1, A2, A3 are all set to a high potential and the three N-type MOS transistors 84, 85, 86 are all turned on, the input terminal of inverter 80 is discharged to Vss. Thus, the output signal of inverter 80 becomes high level, thereby selecting the corresponding control line 38.

The remaining partial selectors of selector 37 are similarly constructed, but the 3-bit address inputs differ from those of RD1. FIG. 7 illustrates the address inputs of the eight partial selectors RD1 to RD8.

The detailed operation of the memory constructed as described above will now be described. It should be understood that although the memory operations described below illustrate a particular sequence, the invention is not limited in this respect. Sequence as used herein refers to any predetermined order.

Figure 8A:
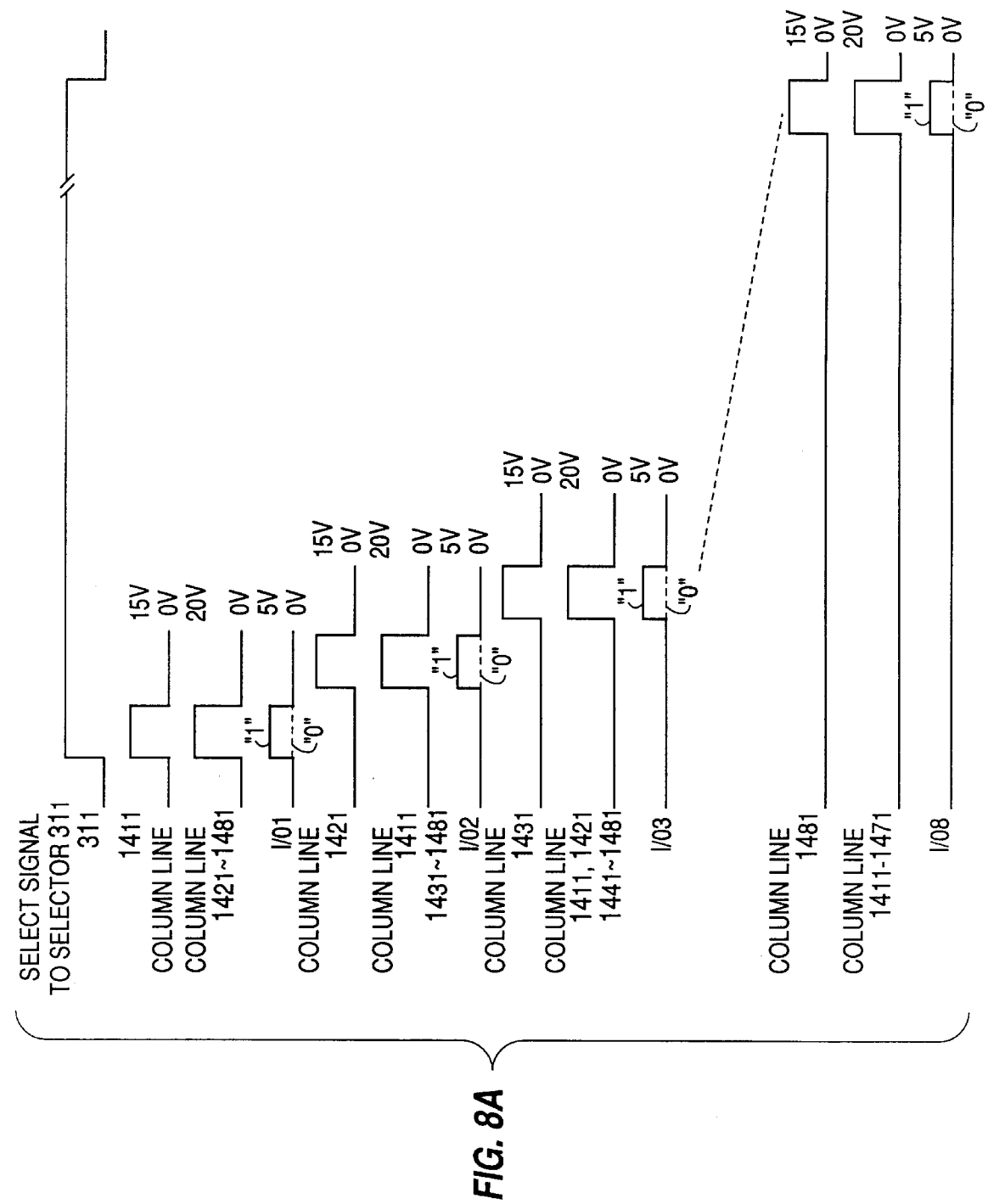

First, the operation of the memory during data writing will be described with reference to the timing charts of FIGS. 8A and 8B. Data is written by selecting one series circuit unit 10 and sequentially writing the data in the eight cells of the selected series circuit unit. Each cell of the selected series circuit unit is sequentially processed with a potential difference of 15 V imposed on the row line coupled to the control gate electrode of the cell being processed and a potential difference of 20 V imposed on the seven remaining row lines.

Suppose, for example, that the selected series circuit unit is coupled to bit line $12_1$ and the eight row lines $14_{11}$ to $14_{81}$. A selection signal is output from row decoder 32 to series circuit selector $31_1$, thereby selecting series circuit selector $31_1$. In addition, a selection signal is output from column decoder 35 in column decoder/input-output circuit 30 to control line $36_1$, and the eight transistors 43 whose gates are coupled to control line $36_1$ are turned on. Then, data from second data lines $40_1$ to $40_8$ may be input to the eight latch circuits $41_{11}$ to $41_{81}$ disposed as shown in FIG. 2. Under the control of the output of series circuit selector 31, a voltage of 15 V is imposed on row line $14_{11}$ and a voltage of 20 V is imposed on the seven remaining row lines $41_{21}$ to $41_{81}$. At this time, all other row lines are maintained at 0 V. Under the control of selector 37, a voltage of 5 V is imposed on control line $38_1$ and a voltage of 0 V is applied to the seven remaining control lines $38_2$ to $38_8$. Thus, the transistor 42 whose gate is coupled to control line $38_1$ (maintained at 5V) is turned on, and the data latched in latch circuit $41_{11}$ can be output to first data line $39_1$. At this point, write data input from data input/output circuit $51_1$ is transmitted to first data line $39_1$ through second data line $40_1$, transistor 43, latch circuit $41_{11}$ and transistor 42. As noted above, signal R/W of control line 49 is set to a high potential during data writing, and thus transistors 45 and 48 are turned on. Write data transmitted to data line $39_1$ may then be output to bit line $12_1$ through data input buffer 47. The voltage of bit line 12 is maintained at one of two different voltages by the data input buffer 47 shown in FIG. 5 in accordance with the data being written. When high-level data is written, it may be set to 10 V, for example, while when low-level data is written, it may be set to 0 V. At this time, all other bit lines are maintained at 0 V.

Figure 17:
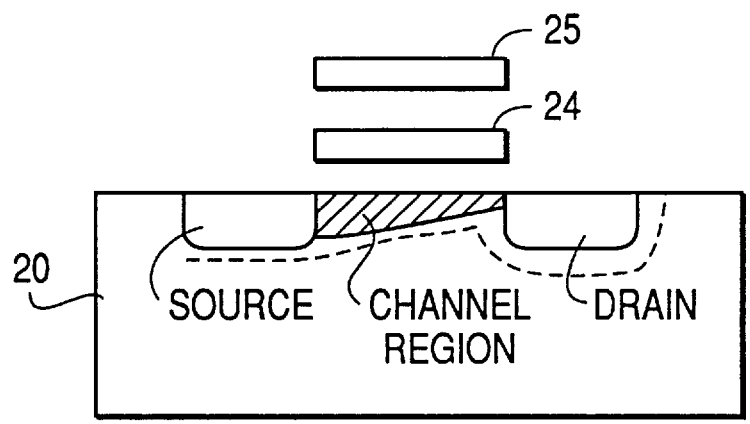
FIGS. 17 and 18 are cross-sectional views showing the nonvolatile transistors provided with a floating gate electrode and a control gate electrode.

The seven memory cells 11 whose control gate electrodes are supplied with the voltage of 20 V operate as triodes (non-saturation operation). In this operation a channel region is formed between the source and drain regions, as shown in FIG. 17.

Figure 18:
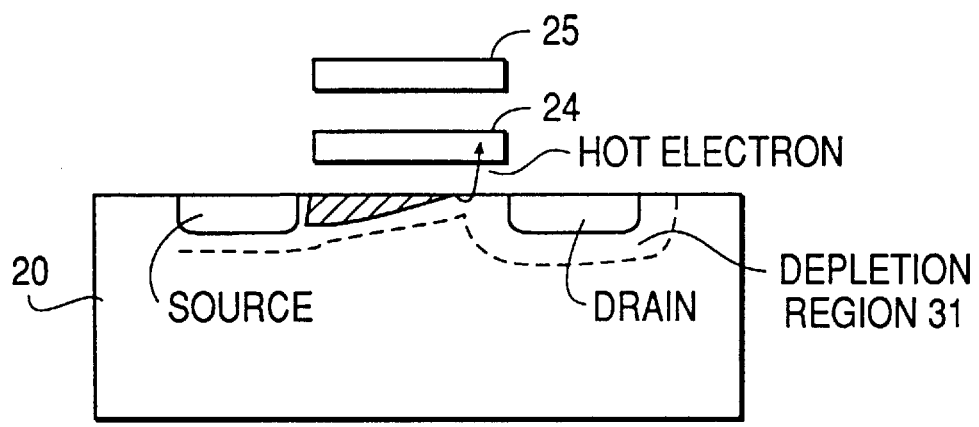

The voltage between bit line $12_1$ and ground line $13_1$ is imposed across the source and drain of the selected cell, connected to column line $14_{11}$. If bit line $12_1$ is maintained at 10 V, electrons travel from the selected cell's source region to its drain region. A concentrated electric field, particularly in the depletion layer formed in the vicinity of the drain region, accelerates the electrons and imparts to them sufficient energy to cross the energy barrier of the insulating film from the surface of substrate 20, as shown in FIG. 18. These electrons are called "hot electrons" and they are drawn to the selected cell's control gate electrode, which is set at the high voltage of 15 V. These hot electrons jump to and are captured by the floating gate electrode. As a result, the floating gate electrode of the selected cell becomes negatively charged and the threshold voltage rises to a high value.

If a voltage of 0 V is applied to bit line $12_1$, the hot electrons are not generated and the threshold voltage remains in its original low state. Data may be written one cell at a time in this manner.

Next, output from series circuit selector 31 causes a voltage of 15 V to be imposed on row line $14_{21}$ and a voltage of 20 V to be imposed on the seven remaining row lines. Likewise, output from selector 37 causes a voltage of 5 V to be imposed on control line $38_2$ and 0 V to be imposed on the seven remaining control lines. Thus, the transistor 42, whose gate is coupled to control line $38_2$ is turned on, and the data latched in latch circuit $41_{21}$ may be output to first data line $39_1$. At this time, data input from data input/output circuit $51_2$(I/02) is transmitted to first data line $39_1$ through second data line $40_2$, transistor 43, latch circuit $41_{21}$ and transistor 42. Thus, data may be written to the memory cell connected to row line $14_{21}$. In a similar manner, data may be sequentially written to each of the remaining cells 11 in the selected series circuit unit 10.

Figure 9A:
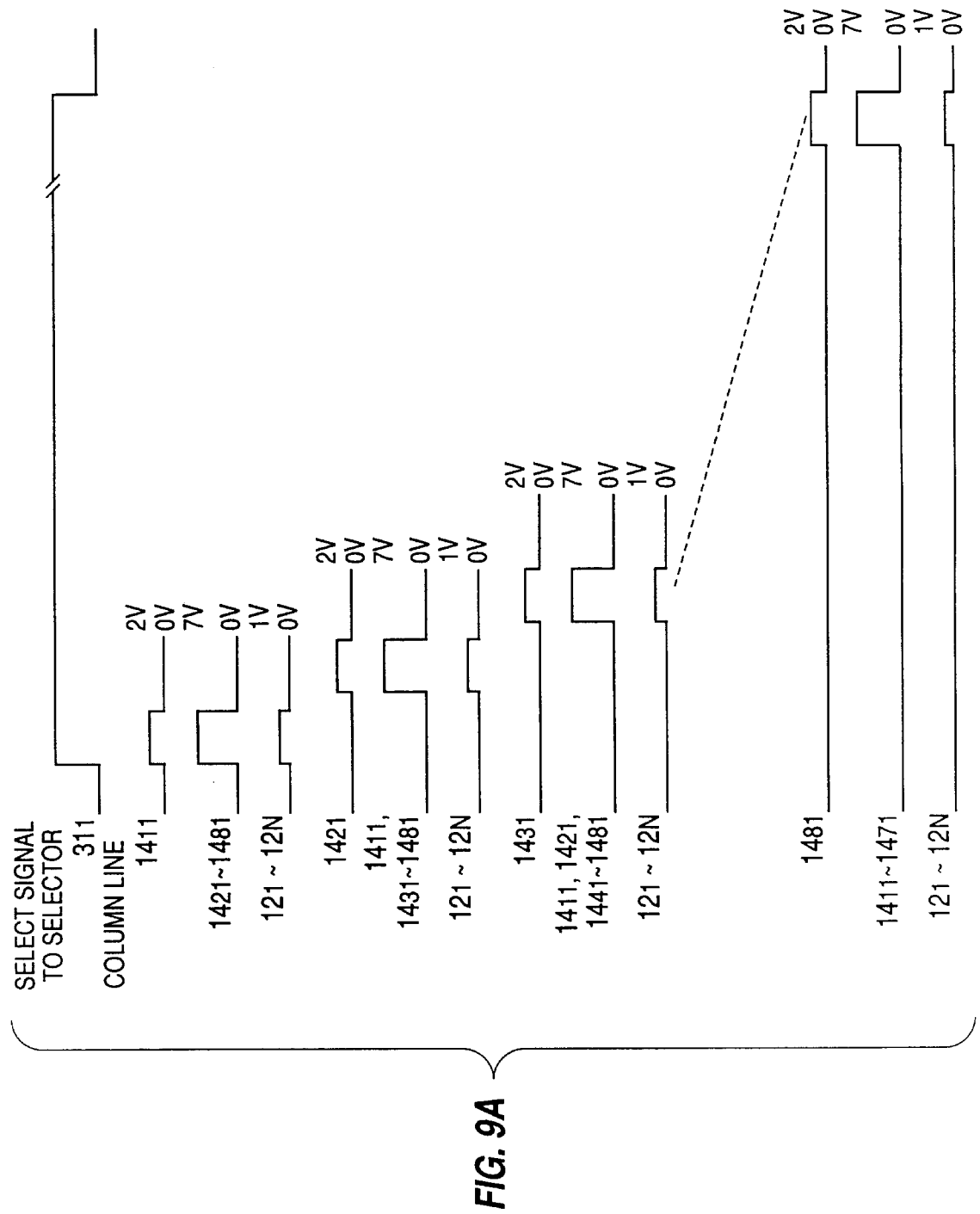
FIGS. 9A and 9B are timing charts associated with reading data from the $E^2$ PROM depicted in FIG. 1.
Figure 9B:
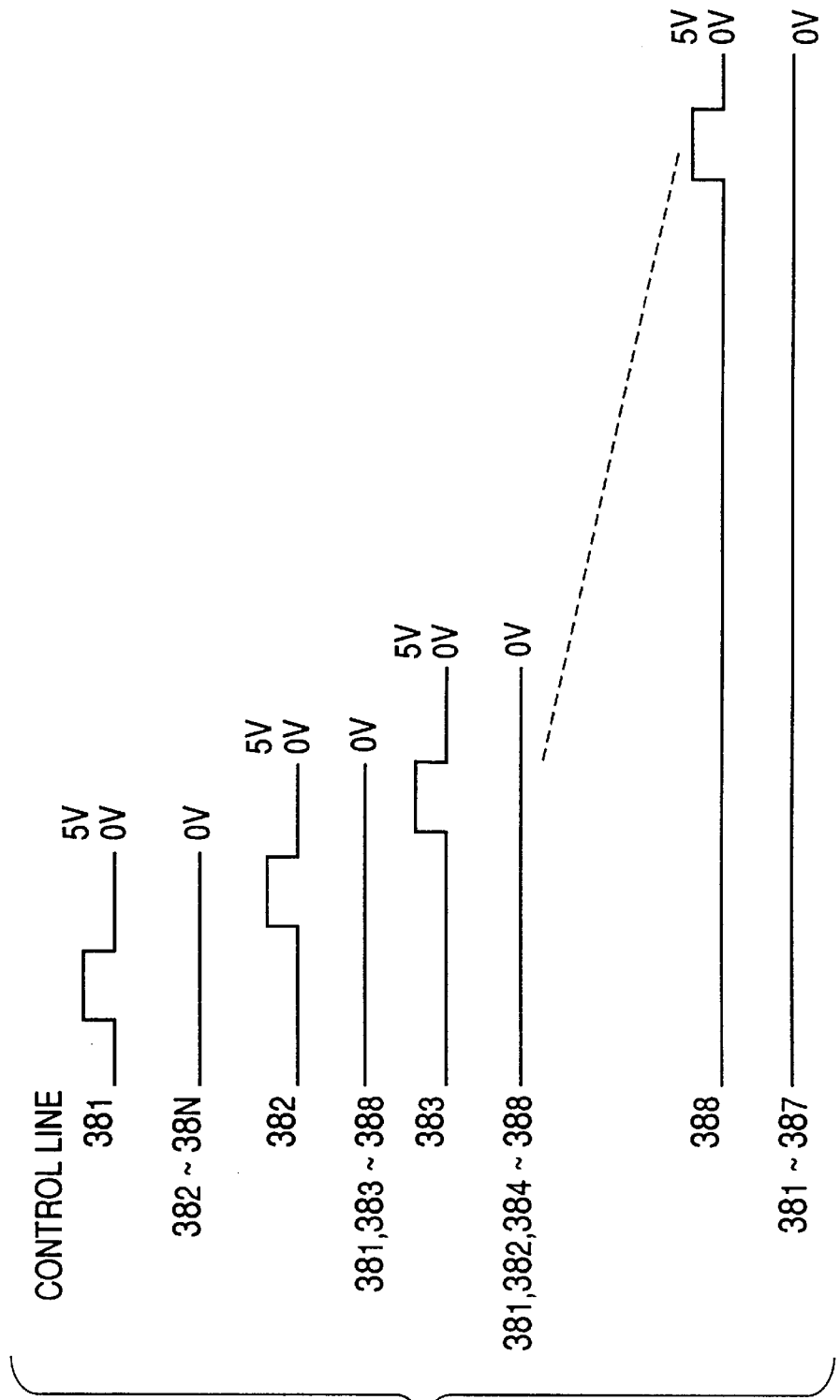

Next, the data reading operation will be described with reference to the timing charts of FIGS. 9A and 9B. During data reading, the N memory cells 11 disposed in a given row of memory cells are simultaneously selected for reading, the selected N cells being read in parallel. Under the control of a series circuit selector 31, a voltage of 2 V is applied to the row line coupled to the control gates of then selected cells, and a voltage of 7 V is applied to the seven remaining row lines. The other row lines are all maintained at 0 V.

Suppose, for example, the selected series circuit units are coupled to the eight row lines $14_{11}$ to $14_{81}$. A voltage of 2 V is initially applied only to row line $14_{11}$, and a voltage of 7 V is applied to the seven remaining row lines $14_{21}$ to $14_{81}$. The threshold voltages of the selected memory cells 11 have been set in accordance with the data written to them during the data writing operation. The voltage of 2 V is, for example, higher than the low threshold voltage of those cells which have had data erased and lower than the high threshold voltage after high-level data is written. The voltage of 7 V is sufficiently higher than the high threshold voltage after high-level data is written. Therefore, applying the described voltages to the eight row lines $14_{11}$ to $14_{81}$ has the effect of turning on the memory cells whose control gate electrodes are coupled to the potential difference of 7 V, namely those cells on row lines $14_{21}$-$_{81}$. However, the ON or OFF state of the selected cells whose control gate electrodes are coupled to column line $14_{11}$, is determined by their threshold voltage, which as noted above, is set during the data write mode.

Sense amplifier 46 coupled to bit lines $12_1$ to $12_N$ is activated during data reading, and the potential of the corresponding bit line 12 is set to the reading voltage, for example, of 1 V by sense amplifier 46. Cells in the row of memory cells which is being processed that have a low threshold voltage (i.e. have low-level data written therein) will be turned on by the voltage of row line $14_{11}$ and thus the read voltage of the corresponding bit line 12 will be discharged to ground level line 13, through the corresponding series circuit unit. If, however, the cell has a high threshold voltage (i.e. has a high-level data written therein), it will remain off despite the imposition of the voltage of row lines $14_{11}$ and the read voltage of the corresponding bit line 12 will not be discharged through the corresponding series circuit unit. Thus, the voltages of the N bit lines $12_1$ to $12_N$ are dependent upon whether the threshold voltage of each of the selected cells is high or low, and amplification of these potential differences by sense amplifiers 46 makes it possible to determine whether high or low-level data is present on the associated bit line. Since signal R/W of signal line 49 is set to a low potential during data reading, the transistors 44 of FIG. 2 are turned on. Thus, the reading data is amplified by sense amplifier 46 and then transmitted in parallel to the N first data lines $39_1$ to $39_N$.

Under the control of selector 37, a voltage of 5 V is applied to control line $38_1$ and 0 V is applied to the seven remaining control lines. Thus, transistors 42 whose gates are coupled to control line $38_1$ (maintained at 5 V), are turned on, and the N bits of data transmitted to first data lines $39_1$ to $39_N$ are latched in parallel in latch circuits $41_{11}$ to $41_{1N}$, respectively.

Next, under the control of series circuit selector 31, a voltage of 2 V is applied to row line $14_{21}$ and a voltage of 7 V is applied to the remaining seven row lines. Thus, data may be read from the N cells coupled to row line $14_{21}$ in a manner similar to that described above, amplified by sense amplifiers 46, determined to be high- or low-level data, and transmitted to data lines $39_1$ to $39_N$ respectively. Under the control of selector 37, a voltage of 5 V is applied to control line $38_2$ and 0 V is applied to the seven remaining control lines. Thus, transistors 42, whose gates are coupled to control line $38_2$ (maintained at 5 V), are turned on, and the data transmitted to the first data lines $39_1$ to $39_N$ is latched in parallel in the N latch circuits $41_{21}$ to $41_{2N}$ disposed in the same row. In a similar manner, data is sequentially read from the cells 11 in similarly processed N series circuit units 10, and transferred to latch circuits 41.

Figure 11:
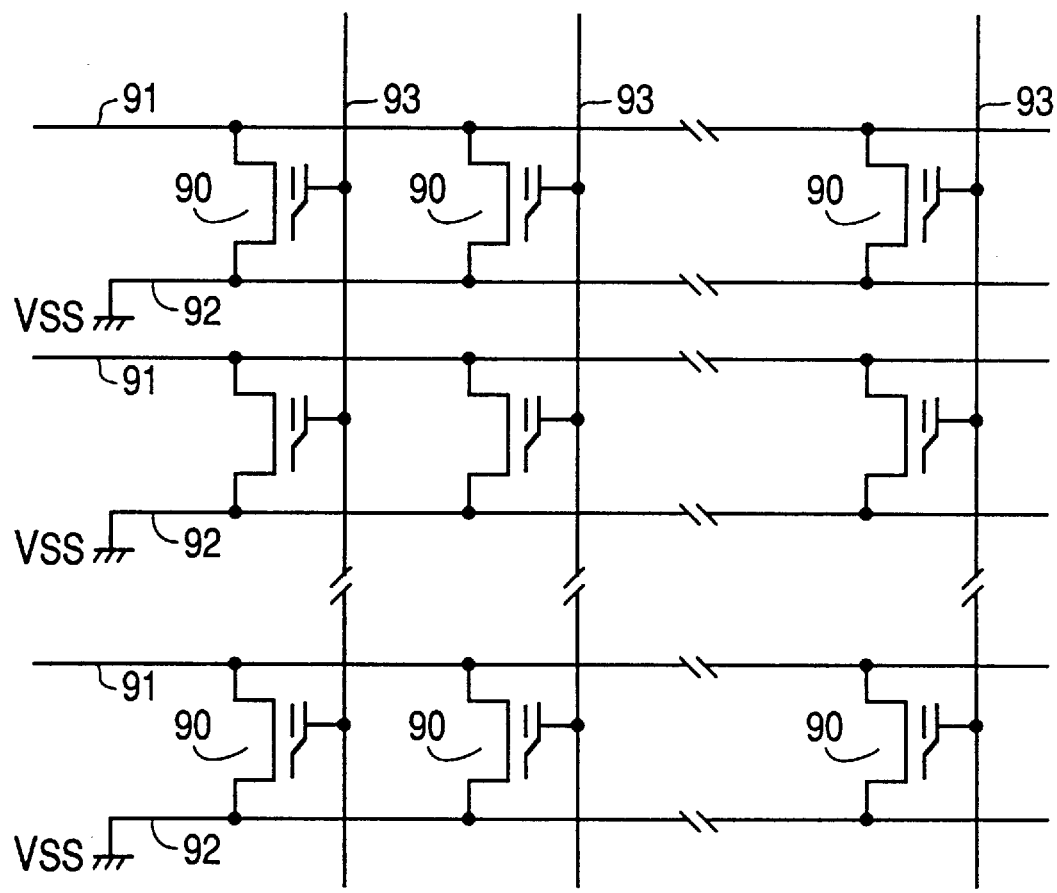
FIG. 11 is a circuit diagram of a prior art non-volatile semiconductor memory.

After eight bits (1 byte) of data from each of the series circuit units 10 in a given row of circuit units are latched in the latch circuits, a selection signal is output to control line $36_1$ by the output of decoder 35, and the eight transistors 43, whose gates are coupled to control line $36_1$, are turned on. Thus, the data latched in latch circuits $41_{11}$ to $41_{81}$, disposed as shown in FIG. 2, are output in parallel to the eight second data lines $40_1$ to $40_8$, and output externally in parallel through data input/output circuits $51_1$ to $51_8$ (I/01 to I/08). Next, the selection signal is output to control line $36_2$, and transistors 43, whose gates are coupled to control line $36_2$, are turned on. Thus, the data latched in latch circuits $41_{12}$ to $41_{82}$ disposed as shown in FIG. 11, is output in parallel to second data lines $40_1$ to $40_8$, and output externally in parallel through data input/output circuits $51_1$ to $51_8$ (I/01 to I/08).

Thus, data stored in the memory cells is sequentially output in eight bit (1 byte) units. Data may be read out in parallel from N series circuit units 10 during data reading. The reading time required when the data is read into latch circuits 41 from series circuit units 10 according to the present invention can be shortened by a factor of 1/N as compared with the memory of the prior art. As a result, even through the data is read in parallel at 8-bit (1 byte) units only after it has been latched in latch circuits 41, the overall data reading rate can be accelerated.

Figure 10:
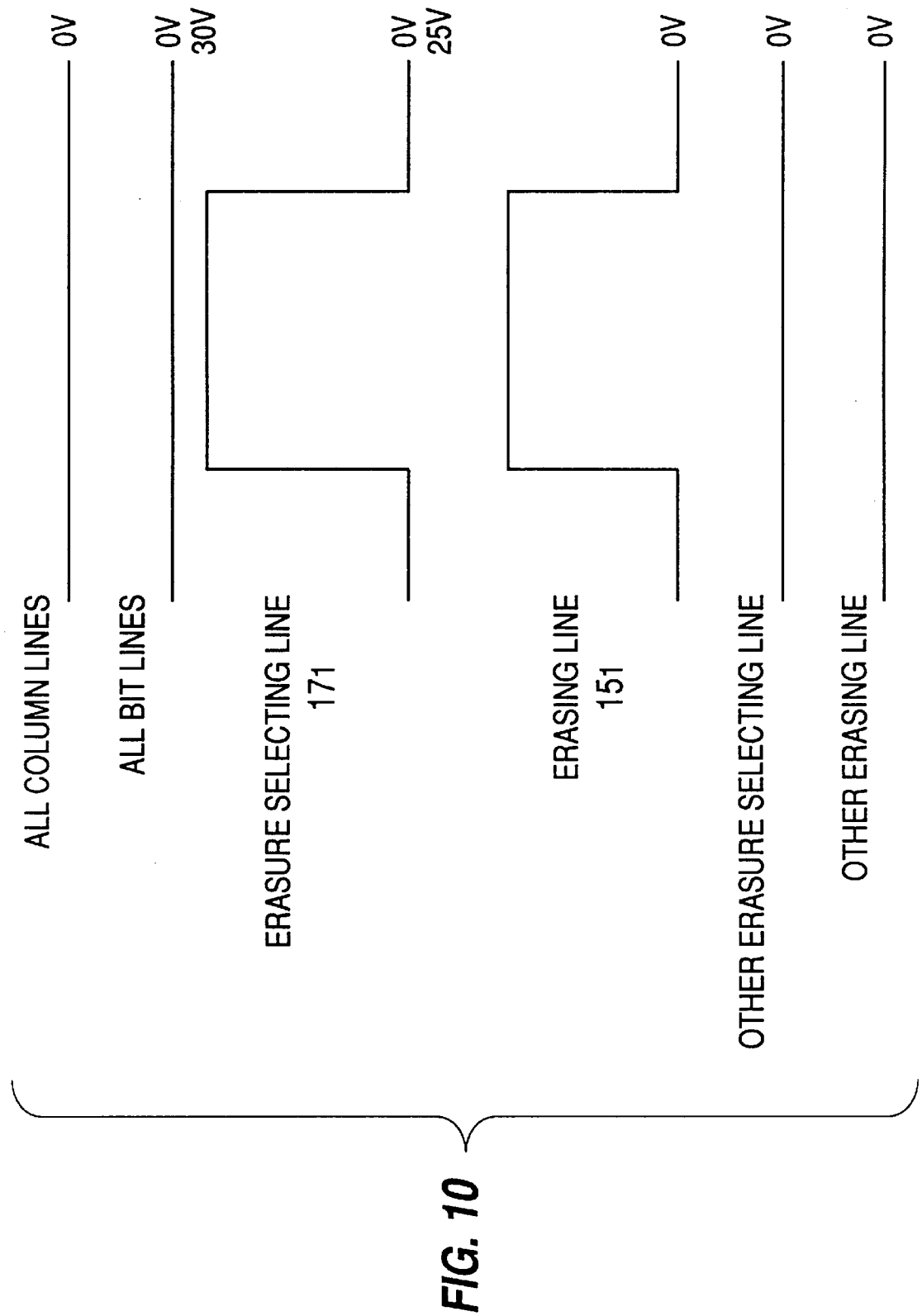
FIG. 10 is a timing chart associated with erasing data from the $E^2$ PROM depicted in FIG. 1.

Finally, data erasure will be described with reference to the timing chart off FIG. 10. Each row line 14 and bit line 12 is maintained at 0 V during data erasure. A high voltage of 30 V is applied to the erase selecting line 17 coupled to the series circuit unit 10 to be erased. A high voltage of 25 V is applied to erase line 15 coupled to the series circuit unit 10 to be erased. In the example of FIG. 10, the series circuit unit 10 to be erased is coupled to bit line $12_1$ and the eight row lines $14_{11}$ to $14_{81}$. Thus, the transistors 16 coupled to the series circuit units 10 disposed in the same row containing the series circuit unit to be erased are turned on. The high voltage of erase line 15, however, is applied only to the common erase gate electrode of the series circuit unit 10 coupled to erase line 15, which is maintained at the high voltage of 25 V. Thus, an electric field emission occurs between the floating gate and erase gate electrodes of the eight cells 11 in the selected series circuit unit 10, and electrons stored in the floating gate electrodes are discharged to the erase gate electrodes. Consequently, the threshold voltages of the cells return to a low-level state, and eight bits of data are erased, i.e., byte erasure is effected.

It is also possible to effect erasure of the data stored in each memory bit simultaneously. In this instance, row decoder 32 and column decoder 35 may be configured so that a high voltage of 30 V is applied to each erase selecting line 17 and a high voltage of 25 V is applied to each erase line 15. Data may also be erased in bit line units.

Thus, the memory of the above-described embodiment permits reading and writing of data in units of 8 bits (1 byte) and electrical data erasure in byte units. Furthermore, one can look to large-scale integration, since the memory cell array includes only one non-volatile transistor for each memory cell. In contrast, conventional memories which permit electrical data erasure in byte units require each bit to comprise two or four transistors and are therefore unable to increase cell integration density. It is only possible to achieve a memory capacity of around 256K bits in such a conventional memory. With the embodiment described above, however, since 1 bit comprises 1 transistor, it is possible to produce a memory with a degree of integration that is the same or better than that of the block erasure type memory illustrated in FIG. 11. Specifically, the above-described embodiment requires the provision of one switching transistor for every eight memory cells 11 and therefore needs 1.125 transistors per bit, or 0.125 more transistors per bit than the memory of FIG. 11. However, the block erasure type memory of FIG. 11 requires formation of a contact for each bit, in order to connect cells to corresponding bit lines. The memory of the present embodiment only needs one contact for every eight cells and so permits an improvement in the degree of integration.

This invention is not limited to the embodiment described above but may be modified in a variety of ways. For example, although description was given above with reference to the case where data erasure is effected in byte units, it is also possible to effect block erasure of data from all cells, as in conventional memories, by the simultaneous imposition of a voltage of 30 V on all the erase selection lines 17 and a voltage of 25 V on all the erase lines 15 in data erasure.

Description was given with respect to the case where a read voltage of 1 V is imposed on bit lines 12 at times of data reading but it is preferable to make this read voltage as low as possible in order to suppress the phenomenon of so-called soft write (weak write-in occurring in read mode).

Further, although the electrodes 25 in FIG. 13 that are used as cell control electrodes and column lines 14 were described as being made of polycrystalline silicon, they may also be made of a high melting point metal silicide, such as titanium silicide or molybdenum silicide, etc., or by another high melting point metal.

In the memory of the above-described embodiments, data can be erased in the multiple bit units, and data can be read at high speed in multiple bit units. Further, a memory cell array may be comprised of memory cells which comprise a single nonvolatile transistor, latch circuits 41 for use in reading data in parallel may be as many as N×8, and those for an overhead may be extremely less as compared with the memory array section. Thus, the circuit of the memory of this embodiment, the memory cells can be highly integrated.

While the foregoing description is directed to a presently preferred embodiment, it will be obvious to one of ordinary skill that various modifications may be made without departing from the true spirit or scope of the invention which is to be limited only by the appended claims.

I claim:

1. A memory device, comprising:
   a circuit unit comprising at least two reprogrammable memory cells connected in series; and
   at least two temporary storage cells coupled to said circuit unit.

2. The memory device according to claim 1, further comprising:
   a data transfer control circuit for controlling a transfer of data from said memory cells of said circuit unit to said temporary storage cells and for controlling a transfer of data from said temporary storage cells to said memory cells of said circuit unit.

3. The memory device according to claim 2, wherein said data transfer control circuit comprises:
   circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

4. The memory device according to claim 1, wherein a number of memory cells in said circuit unit is equal to a number of temporary storage cells.

5. A memory device, comprising:
   a circuit unit comprising at least two reprogrammable memory cells connected in series;
   at least two temporary storage cells; and
   a data transfer circuit coupled between said circuit unit and said temporary storage cells for transferring data from said memory cells of said circuit unit to said temporary storage cells and for transferring data from said temporary storage cells to said memory cells of said circuit unit.

6. The memory device according to claim 5, wherein said data transfer circuit comprises a transistor.

7. The memory device according to claim 6, wherein said transistor comprises a MOS transistor.

8. The memory device according to claim 5, further comprising:
   a data transfer control circuit for controlling a transfer of data from said memory cells of said circuit unit to said temporary storage cells via said data transfer circuit and for controlling a transfer of data from said temporary storage cells to said memory cells of said circuit unit via said data transfer circuit.

9. The memory device according to claim 8, wherein said data transfer control circuit comprises:
   circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

10. The memory device according to claim 5, wherein said data transfer circuit is in an inactive state after data is transferred from said memory cells of said circuit unit to said temporary storage cells and after data is transferred from said temporary storage cells to said memory cells of said circuit unit.

11. A memory device, comprising:
    a bit line;
    a circuit unit coupled to said bit line and comprising at least two reprogrammable memory cells connected in series;
    at least two temporary storage cells;
    a data line coupled to said temporary storage cells;
    a data transfer circuit coupled between said bit line and said data line for transferring data of said memory cells of said circuit unit from said bit line to said data line and for transferring data of said temporary storage cells from said data line to said bit line; and
    first switches, responsive to first control signals and each coupled between said data line and a corresponding one of said temporary storage cells, for transferring data between said data line and said temporary storage cells.

12. The memory device according to claim 11, wherein said first switches comprise first transistors each having a first current terminal coupled to said data line, a second current terminal coupled to the corresponding one of said temporary storage cells, and a control terminal for receiving the first control signals.

13. The memory device according to claim 12, wherein said first transistors comprise MOS transistors.

14. The memory device according to claim 11, further comprising:
    a selector circuit for generating the first control signals in response to address data.

15. The memory circuit according to claim 14, wherein said selector circuit comprises a plurality of partial selectors.

16. The memory circuit according to claim 15, wherein said partial selectors each comprise:
    first transistors each having a first current terminal coupled to a power supply voltage, a second current terminal coupled to a common node, and a control terminal receiving the address data;
    second transistors connected in series between said common node and a reference potential, each of said second transistors having a control terminal receiving the address data; and
    an inverter having an input terminal coupled to said common node and an output terminal for outputting the first control signals.

17. The memory device according to claim 11, further comprising:

a data transfer control circuit for controlling a transfer of data from said memory cells of said circuit unit to said temporary storage cells via said first switches and for controlling a transfer of data from said temporary storage cells to said memory cells of said circuit unit via said first switches.

18. The memory device according to claim 17, wherein said data transfer control circuit comprises:

circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

19. The memory device according to claim 11, wherein said first switches are in an inactive state after data is transferred from said memory cells to said temporary storage cells and after data is transferred from said temporary storage cells to said memory cells of said circuit unit.

20. The memory device according to claim 11, further comprising:

an input/output circuit coupled to said temporary storage cells for inputting data to and outputting data from said temporary storage cells.

21. The memory device according to claim 20, further comprising:

a data transfer control circuit for controlling a transfer of data from said memory cells of said circuit unit to said input/output circuit via said temporary storage cells and for controlling a transfer of data from said input/output circuit to said memory cells of said circuit unit via said temporary storage cells.

22. The memory device according to claim 21, wherein said data transfer control circuit comprises:

circuit responsive to address data for controlling the transfer of data from said memory cells of said circuit unit to said input/output circuit via said temporary storage cells in accordance with a predetermined sequence and for controlling the transfer of data from said input/output circuit to said memory cells of said circuit unit via said temporary storage cells in accordance with a predetermined sequence.

23. The memory device according to claim 20, further comprising:

a data transfer control circuit for controlling a transfer of data from said memory cells of said circuit unit to said temporary storage cells and for controlling a transfer of data from said temporary storage cells to said memory cells of said circuit unit.

24. The memory device according to claim 22, wherein said data transfer control circuit comprises:

circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

25. The memory device according to claim 20, further comprising:

a data transfer control circuit for controlling a transfer of data from said temporary storage cells to said input/output circuit and for controlling a transfer of data from said input/output circuit to said temporary storage cells.

26. The memory device according to claim 20, further comprising:

input/output data lines coupling said temporary storage cells and said input/output circuit; and second switches coupled between said temporary storage cells and said input/output data lines for transferring data between said temporary storage cells and said input/output circuit.

27. The memory device according to claim 26, wherein said second switches comprise transistors each having a first current terminal coupled to a corresponding one of said temporary storage cells, a second current terminal coupled to a respective one of said input/output data lines, and a control terminal.

28. The memory device according to claim 27, wherein said transistors comprise MOS transistors.

29. The memory device according to claim 26, further comprising:

a data transfer control circuit for controlling a transfer of data from said temporary storage cells to said input/output circuit via said second switches and for controlling a transfer of data from said input/output circuit to said temporary storage cells via said second switches.

30. The memory device according to claim 29, wherein said data transfer control circuit comprises:

circuit responsive to address data for controlling the transfer of data from said temporary storage cells to said input/output circuit in accordance with a predetermined sequence and for controlling the transfer of data from said input/output circuit to said temporary storage cells in accordance with a predetermined sequence.

31. The memory device according to claim 26, wherein said second switches are in an inactive state after data is transferred from said temporary storage cells to said input/output circuit and after data is transferred from said input/output circuit to said temporary storage cells.

32. The memory device according to claim 11, further comprising:

an input/output circuit comprising a plurality of input/output circuit sections, each input/output circuit section coupled to a corresponding one of said temporary storage cells for inputting data to and outputting data from the corresponding one of said temporary storage cells.

33. The memory device according to claim 32, further comprising:

a data transfer control circuit for controlling a transfer of data from said memory cells of said circuit unit to said input/output circuit sections via said temporary storage cells and for controlling a transfer of data from said input/output circuit sections to said memory cells of said circuit unit via said temporary storage cells.

34. The memory device according to claim 33, wherein said data transfer control circuit comprises:

a circuit responsive to address data for controlling the transfer of data from said memory cells of said circuit unit to said input/output circuit sections via said temporary storage cells in accordance with a predetermined sequence and for controlling the transfer of data from said input/output circuit sections to said memory cells of said circuit unit via said temporary storage cells in accordance with a predetermined sequence.

35. The memory device according to claim 32, further comprising:

a data transfer control circuit for controlling a transfer of data from said memory cells of said circuit unit to said temporary storage cells and for controlling a transfer of data from said temporary storage cells to said memory cells of said circuit unit.

36. The memory device according to claim 35, wherein said data transfer control circuit comprises:

circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

37. The memory device according to claim 32, further comprising:

a data transfer control circuit for controlling a transfer of data from said temporary storage cells to said input/output circuit sections and for controlling a transfer of data from said input/output circuit sections to said temporary storage cells.

38. The memory device according to claim 32, further comprising:

second switches responsive to second control signals and respectively coupled between said temporary storage cells and said input/output circuit sections for transferring data between said temporary storage cells and said input/output circuit sections.

39. The memory device according to claim 38, wherein said second switches comprise transistors each having a first current terminal coupled to a corresponding one of said input/output circuit sections, a second current terminal coupled to a corresponding one of said temporary storage cells, and a control terminal for receiving the second control signals.

40. The memory device according to claim 39, wherein said transistors comprise MOS transistors.

41. The memory device according to claim 38, further comprising:

a data transfer control circuit for controlling a transfer of data from said temporary storage cells to said input/output circuit sections via said second switches and for controlling a transfer of data from said input/output circuit sections to said temporary storage cells via said second switches.

42. The memory device according to claim 38, wherein said second switches are in an inactive state after data is transferred from said temporary storage cells to said input/output circuit sections and after data is transferred from said input/output circuit sections to said temporary storage cells.

43. The memory device according to claim 38, further comprising:

a selector for generating the second control signals in response to address data.

44. A memory device, comprising:

a circuit unit comprising at least two memory cells connected in series;

at least two temporary storage cells;

a data transfer circuit coupled between said circuit unit and said temporary storage cells for transferring data from said memory cells of said circuit unit to said temporary storage cells and for transferring data from said temporary storage cells to said memory cells of said circuit unit; and an input/output circuit coupled to said temporary storage cells for inputting data to and outputting data from said temporary storage cells.

45. The memory device according to claim 44, further comprising:

a data transfer control circuit for controlling a transfer of data from said memory cells of said circuit unit to said input/output circuit via said temporary storage cells and for controlling a transfer of data from said input/output circuit to said memory cells of said circuit unit via said temporary storage cells.

46. The memory device according to claim 45, wherein said data transfer control circuit comprises:

circuit responsive to address data for controlling the transfer of data from said memory cells of said circuit unit to said input/output circuit via said temporary storage cells in accordance with a predetermined sequence and for controlling the transfer of data from said input/output circuit to said memory cells of said circuit unit via said temporary storage cells in accordance with a predetermined sequence.

47. The memory device according to claim 44, further comprising:

a data transfer control circuit for controlling a transfer of data from said memory cells of said circuit unit to said temporary storage cells and for controlling a transfer of data from said temporary storage cells to said memory cells of said circuit unit.

48. The memory device according to claim 47, wherein said data transfer control circuit comprises:

circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

49. The memory device according to claim 44, further comprising:

a data transfer control circuit for controlling a transfer of data from said temporary storage cells to said input/output circuit and for controlling a transfer of data from said input/output circuit to said temporary storage cells.

50. The memory device according to claim 44, further comprising:

switches respectively coupled between said temporary storage cells and said input/output circuit for transferring data between said temporary storage cells and said input/output circuit.

51. The memory device according to claim 50, wherein said switches comprise transistors.

52. The memory device according to claim 51, wherein said transistors comprise MOS transistors.

53. The memory device according to claim 50, further comprising:

a data transfer control circuit for controlling a transfer of data from said temporary storage cells to said input/output circuit via said switches and for controlling a transfer of data from said input/output circuit to said temporary storage cells via said switches.

54. The memory device according to claim 53, wherein said data transfer control circuit comprises:

circuit responsive to address data for controlling the transfer of data from said temporary storage cells to said input/output circuit in accordance with a predetermined sequence and for controlling the transfer of data from said input/output circuit to said temporary storage cells in accordance with a predetermined sequence.

55. The memory device according to claim 50, wherein said switches are in an inactive state after data is transferred from said temporary storage cells to said input/output circuit and after data is transferred from said input/output circuit to said temporary storage cells.

56. A memory device, comprising:
- a circuit unit comprising at least two memory cells connected in series;
- at least two temporary storage cells;
- a data transfer circuit coupled between said circuit unit and said temporary storage cells for transferring data from said memory cells of said circuit unit to said temporary storage cells and for transferring data from said temporary storage cells to said memory cells of said circuit unit; and
- an input/output circuit comprising a plurality of input/output circuit sections, each input/output circuit section coupled to a corresponding one of said temporary storage cells for inputting data to and outputting data from the corresponding one of said temporary storage cells.

57. The memory device according to claim 56, further comprising:
- a data transfer control circuit for controlling a transfer of data from said memory cells of said circuit unit to said input/output circuit sections via said temporary storage cells and for controlling a transfer of data from said input/output circuit sections to said memory cells of said circuit unit via said temporary storage cells.

58. The memory device according to claim 57, wherein said data transfer control circuit comprises:
- a circuit responsive to address data for controlling the transfer of data from said memory cells of said circuit unit to said input/output circuit sections via said temporary storage cells in accordance with a predetermined sequence and for controlling the transfer of data from said input/output circuit sections to said memory cells of said circuit unit via said temporary storage cells in accordance with a predetermined sequence.

59. The memory device according to claim 56, further comprising:
- a data transfer control circuit for controlling a transfer of data from said memory cells of said circuit unit to said temporary storage cells and for controlling a transfer of data from said temporary storage cells to said memory cells of said circuit unit.

60. The memory device according to claim 59, wherein said data transfer control circuit comprises:
- a circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

61. The memory device according to claim 56, further comprising:
- a data transfer control circuit for controlling a transfer of data from said temporary storage cells to said input/output circuit sections for controlling a transfer of data from said input/output circuit sections to said temporary storage cells.

62. The memory device according to claim 56, further comprising:
- switches responsive to control signals and respectively coupled between said temporary storage cells and said input/output circuit sections for transferring data between said temporary storage cells and said input/output circuit sections.

63. The memory device according to claim 62, wherein said switches comprise transistors each having a first current terminal coupled to a corresponding one of said input/output circuit sections, a second current terminal coupled to a corresponding one of said temporary storage cells, and a control terminal for receiving the control signals.

64. The memory device according to claim 63, wherein said transistors comprise MOS transistors.

65. The memory device according to claim 62, further comprising:
- a data transfer control circuit for controlling a transfer of data from said temporary storage cells to said input/output circuit sections via said switches and for controlling a transfer of data from said input/output circuit sections to said temporary storage cells via said switches.

66. The memory device according to claim 62, wherein said switches are in an inactive state after data is transferred from said temporary storage cells to said input/output circuit sections and after data is transferred from said input/output circuit sections to said temporary storage cells.

67. The memory device according to claim 62, further comprising:
- a selector for generating the control signals in response to address data.

68. A memory device, comprising:
- a circuit unit comprising at least two reprogrammable memory cells connected in series;
- a data line coupled to said circuit unit;
- at least two temporary storage cells; and
- first switches, responsive to first control signals and each coupled between said data line and a corresponding one of said temporary storage celss, for controlling the transfer of data between said memory cells of said circuit unit and said temporary storage cells.

69. The memory device according to claim 68, wherein said first switches comprise first transistors each having a first current terminal coupled to said data line, a second current terminal coupled to the corresponding one of said temporary storage cells, and a control terminal for receiving the first control signals.

70. The memory device according to claim 69, wherein said first transistors comprise MOS transistors.

71. The memory device according to claim 68, further comprising:
- a selector circuit for generating the first control signals in response to address data.

72. The memory device according to claim 68, further comprising:
- a data transfer control circuit for controlling a transfer of data from said memory cells of said circuit unit to said temporary storage cells via said first switches and for controlling a transfer of data from said temporary storage cells to said memory cells of said circuit unit via said first switches.

73. The memory device according to claim 72, wherein said data transfer control circuit comprises:
- a circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

74. The memory device according to claim 68, wherein said first switches are in an inactive state after data is transferred from said memory cells of said circuit unit to said temporary storage cells and after data is transferred from said temporary storage cells to said memory cells of said circuit unit.

75. The memory device according to claim 68, further comprising:

input/output data lines; and an input/output circuit coupled to said input/out data lines for inputting data to and outputting data from said temporary storage cells.

76. The memory device according to claim 75, further comprising:

a data transfer control circuit for controlling a transfer of data from said memory cells of said circuit unit to said input/output circuit via said temporary storage cells and for controlling a transfer of data from said input/output circuit to said memory cells of said circuit unit via said temporary storage cells.

77. The memory device according to claim 76, wherein said data transfer control circuit comprises:

a circuit responsive to address data for controlling the transfer of data from said memory cells of said circuit unit to said input/output circuit via said temporary storage cells in accordance with a predetermined sequence and for controlling the transfer of data from said input/output circuit to said memory cells of said circuit unit via said temporary storage cells in accordance with a predetermined sequence.

78. The memory device according to claim 75, further comprising:

a data transfer control circuit for controlling a transfer of data from said memory cells of said circuit unit to said temporary storage cells and for controlling a transfer of data from said temporary storage cells to said memory cells of said circuit unit.

79. The memory device according to claim 78, wherein said data transfer control circuit comprises:

a circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

80. The memory device according to claim 75, further comprising:

a data transfer control circuit for controlling a transfer of data from said temporary storage cells to said input/output circuit and for controlling a transfer of data from said input/output circuit to said temporary storage cells.

81. The memory device according to claim 75, further comprising:

second switches coupled between said temporary storage cells and said input/output circuit for transferring data between said temporary storage cells and said input/output circuit.

82. The memory device according to claim 81, wherein said second switches comprise transistors each having a first current terminal coupled to a corresponding one of said temporary storage cells, a second current terminal coupled to said input/output circuit, and a control terminal.

83. The memory device according to claim 82, wherein said transistors comprise MOS transistors.

84. The memory device according to claim 81, further comprising:

a data transfer control circuit for controlling a transfer of data from said temporary storage cells to said input/output circuit via said second switches and for controlling a transfer of data from said input/output circuit to said temporary storage cells via said second switches.

85. The memory device according to claim 81, wherein said second switches are in an inactive state after data is transferred from said temporary storage cells to said input/output circuit and after data is transferred from said input/output circuit to said temporary storage cells.

86. The memory device according to claim 68, further comprising:

an input/output circuit comprising a plurality of input/output circuit sections, each input/output circuit section coupled to a corresponding one of said temporary storage cells for inputting data to and outputting data from the corresponding one of said temporary storage cells.

87. The memory device according to claim 86, further comprising:

a data transfer control circuit for controlling a transfer of data from said memory cells of said circuit unit to said input/output circuit sections via said temporary storage cells and for controlling a transfer of data from said input/output circuit sections to said memory cells of said circuit unit via said temporary storage cells.

88. The memory device according to claim 87, wherein said data transfer control circuit comprises:

a circuit responsive to address data for controlling the transfer of data from said memory cells of said circuit unit to said input/output circuit sections via said temporary storage cells in accordance with a predetermined sequence and for controlling the transfer of data from said input/output circuit sections to said memory cells of said circuit unit via said temporary storage cells in accordance with a predetermined sequence.

89. The memory device according to claim 86, further comprising:

a data transfer control circuit for controlling a transfer of data from said memory cells of said circuit unit to said temporary storage cells and for controlling a transfer of data from said temporary storage cells to said memory cells of said circuit unit.

90. The memory device according to claim 89, wherein said data transfer control circuit comprises:

circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

91. The memory device according to claim 86, further comprising:

a data transfer control circuit for controlling a transfer of data from said temporary storage cells to said input/output circuit sections and for controlling a transfer of data from said input/output circuit sections to said temporary storage cells.

92. The memory device according to claim 86, further comprising:

second switches responsive to second control signals and coupled between said temporary storage cells and said input/output circuit sections for transferring data between said temporary storage cells and said input/output circuit sections.

93. The memory device according to claim 92, wherein said second switches comprise second transistors each having a first current terminal coupled to a corresponding one of said input/output circuit sections, a second current terminal coupled to a corresponding one of said temporary storage cells, and a control terminal for receiving the second control signals.

94. The memory device according to claim 93, wherein said second transistors comprise MOS transistors.

95. The memory device according to claim 92, further comprising:
a data transfer control circuit for controlling a transfer of data from said temporary storage cells to said input/output circuit sections via said second switches and for controlling a transfer of data from said input/output circuit sections to said temporary storage cells via said second switches.

96. The memory device according to claim 92, wherein said second switches are in an inactive state after data is transferred from said temporary storage cells to said input/output circuit sections and after data is transferred from said input/output circuit sections to said temporary storage cells.

97. The memory device according to claim 92, further comprising:
a selector for generating the second control signals in response to address data.

98. A memory device, comprising:
a circuit unit comprising at least two memory cells connected in series;
at least two temporary storage cells coupled to said circuit unit; and
an input/output circuit coupled to said temporary storage cells for inputting data to and outputting data from said temporary storage cells.

99. The memory device according to claim 98, further comprising:
a data transfer control circuit for controlling a transfer of data from said memory cells of said circuit unit to said input/output circuit via said temporary storage cells and for controlling a transfer of data from said input/output circuit to said memory cells of said circuit unit via said temporary storage cells.

100. The memory device according to claim 99, wherein said data transfer control circuit comprises:
a circuit responsive to address data for controlling the transfer of data from said memory cells of said circuit unit to said input/output circuit via said temporary storage cells in accordance with a predetermined sequence and for controlling the transfer of data from said input/output circuit to said memory cells of said circuit unit via said temporary storage cells in accordance with a predetermined sequence.

101. The memory device according to claim 98, further comprising:
a data transfer control circuit for controlling a transfer of data from said memory cells of said circuit unit to said temporary storage cells and for controlling a transfer of data from said temporary storage cells to said memory cells of said circuit unit.

102. The memory device according to claim 101, wherein said data transfer control circuit comprises:
a circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

103. The memory device according to claim 98, further comprising:
a data transfer control circuit for controlling a transfer of data from said temporary storage cells to said input/output circuit and for controlling a transfer of data from said input/output circuit to said temporary storage cells.

104. The memory device according to claim 98, further comprising:
switches coupled between said temporary storage cells and said input/output circuit for transferring data between said temporary storage cells and said input/output circuit.

105. The memory device according to claim 104, wherein said switches comprise transistors each having a first current terminal coupled to said input/output circuit, a second current terminal coupled to a corresponding one of said temporary storage cells, and a control terminal.

106. The memory device according to claim 105, wherein said transistors comprise MOS transistors.

107. The memory device according to claim 104, further comprising:
a data transfer control circuit for controlling a transfer of data from said temporary storage cells to said input/output circuit via said switches and for controlling a transfer of data from said input/output circuit to said temporary storage cells via said switches.

108. The memory device according to claim 104, wherein said switches are in an inactive state after data is transferred from said temporary storage cells to said input/output circuit and after data is transferred from said input/output circuit to said temporary storage cells.

109. A memory device, comprising:
a circuit unit comprising at least two memory cells connected in series;
at least two temporary storage cells coupled to said circuit unit; and
an input/output circuit comprising a plurality of input/output circuit sections, each input/output circuit section coupled to a corresponding one of said temporary storage cells for inputting data to and outputting data from the corresponding one of said temporary storage cells.

110. The memory device according to claim 109, further comprising:
a data transfer control circuit for controlling a transfer of data from said memory cells of said circuit unit to said input/output circuit sections via said temporary storage cells and for controlling a transfer of data from said input/output circuit sections to said memory cells of said circuit unit via said temporary storage cells.

111. The memory device according to claim 110, wherein said data transfer control circuit comprises:
a circuit responsive to address data for controlling the transfer of data from said memory cells of said circuit unit to said input/output circuit sections via said temporary storage cells in accordance with a predetermined sequence and for controlling the transfer of data from said input/output circuit sections to said memory cells of said circuit unit via said temporary storage cells in accordance with a predetermined sequence.

112. The memory device according to claim 109, further comprising:
a data transfer control circuit for controlling a transfer of data from said memory cells of said circuit unit to said temporary storage cells and for controlling a transfer of data from said temporary storage cells to said memory cells of said circuit unit.

113. The memory device according to claim 112, wherein said data transfer control circuit comprises:
a circuit responsive to address data for controlling the transfer of data from said memory cells of said circuit unit to said temporary storage cells in accordance with a predetermined sequence and for controlling the transfer of data from said temporary storage cells to said memory cells of said circuit unit in accordance with a predetermined sequence.

114. The memory device according to claim 109, further comprising:
a data transfer control circuit for controlling a transfer of data from said temporary storage cells to said input/output circuit sections and for controlling a transfer of data from said input/output circuit sections to said temporary storage cells.

115. The memory device according to claim 109, further comprising:
switches responsive to control signals and coupled between said temporary storage cells and said input/output circuit sections for transferring data between said temporary storage cells and said input/output circuit sections.

116. The memory device according to claim 115, wherein said switches comprise transistors each having a first current terminal coupled to a corresponding one of said input/output circuit sections, a second current terminal coupled to a corresponding one of said temporary storage cells, and a control terminal for receiving the control signals.

117. The memory device according to claim 116, wherein said transistors comprise MOS transistors.

118. The memory device according to claim 115, further comprising:
a data transfer control circuit for controlling a transfer of data from said temporary storage cells to said input/output circuit sections via said switches and for controlling a transfer of data from said input/output circuit sections to said temporary storage cells via said switches.

119. The memory device according to claim 115, wherein said switches are in an inactive state after data is transferred from said temporary storage cells to said input/output circuit sections and after data is transferred from said input/output circuit sections to said temporary storage cells.

120. The memory device according to claim 115, further comprising:
a selector for generating the control signals.

121. A memory device, comprising:
a bit line;
at least two circuit units coupled to said bit line, each circuit unit comprising at least two reprogrammable memory cells connected in series; and
at least two temporary storage cells coupled to said bit line.

122. The memory device according to claim 121, further comprising:
a data transfer control circuit for controlling a transfer of data from said memory cells of said circuit units to said temporary storage cells and for controlling a transfer of data from said temporary storage cells to said memory cells of said circuit units.

123. The memory device according to claim 122, wherein said data transfer control circuit comprises:
a circuit responsive to address data for controlling a transfer of data from said memory cells of said circuit units to said temporary storage cells in accordance with a predetermined sequence and for controlling a transfer of data from said temporary storage cells to said memory cells of said circuit units in accordance with a predetermined sequence.

124. The memory device according to claim 121, wherein a number of memory cells in each of said circuit units is equal to a number of temporary storage cells.

125. A memory device, comprising:
a bit line;
at least two circuit units coupled to said bit line, each circuit unit comprising at least two memory cells connected in series;
at least two temporary storage cells;
a data line coupled to said temporary storage cells; and
a data transfer circuit coupled between said bit line and said data line for transferring data from said memory cells of said circuit units to said temporary storage cells and for transferring data from said temporary storage cells to said memory cells of said circuit units.

126. The memory device according to claim 125, wherein said data transfer circuit comprises a transistor.

127. The memory device according to claim 126, wherein said transistor comprises a MOS transistor.

128. The memory device according to claim 125, further comprising:
a data transfer control circuit for controlling a transfer of data from said memory cells of said circuit units to said temporary storage cells via said data transfer circuit and for controlling a transfer of data from said temporary storage cells to said memory cells of said circuit units via said data transfer circuit.

129. The memory device according to claim 128, wherein said data transfer control circuit comprises:
a circuit responsive to address data for controlling the transfer of data from said memory cells of said circuit units to said temporary storage cells in accordance with a predetermined sequence and for controlling a transfer of data from said temporary storage cells to said memory cells of said circuit units in accordance with a predetermined sequence.

130. The memory device according to claim 125, wherein said data transfer circuit is in an inactive state after data is transferred from said memory cells of said circuit units to said temporary storage cells and after data is transferred from said temporary storage cells to said memory cells of said circuit units.

131. A memory device, comprising:
a bit line;
at least two circuit units coupled to said bit line, each circuit unit comprising at least two memory cells connected in series;
at least two temporary storage cells;
a data line coupled to said temporary storage cells;
a data transfer circuit coupled between said bit line and said data line for transferring data of said memory cells of said circuit units from said bit line to said data line and for transferring data of said temporary storage cells from said data line to said bit line; and
first switches, responsive to first control signals and each coupled between said data line and a corresponding one of said temporary cells, for transferring data between said data line and said temporary storage cells.

132. The memory device according to claim 131, wherein said first switches comprise first transistors each having a first current terminal coupled to said data line, a second current terminal coupled to the corresponding one of said temporary storage cells, and a control terminal for receiving the first control signals.

133. The memory device according to claim 132, wherein said first transistors comprise MOS transistors.

134. The memory device according to claim 131, further comprising:

a selector circuit for generating the first control signals in response to address data.

135. The memory device according to claim 134, wherein said selector circuit comprises a plurality of partial selectors.

136. The memory device according to claim 135, wherein said partial selectors each comprise:

first transistors each having a first current terminal coupled to a power supply voltage, a second current terminal coupled to a common node, and a control terminal receiving the address data;

second transistors connected in series between said common node and a reference potential, each of said second transistors having a control terminal receiving the address data; and an inverter having an input terminal coupled to said common node and an output terminal for outputting the first control signals.

137. The memory device according to claim 131, further comprising:

a data transfer control circuit for controlling a transfer of data from said memory cells of said circuit units to said temporary storage cells via said first switches and for controlling a transfer of data from said temporary storage cells to said memory cells of said circuit units via said first switches.

138. The memory device according to claim 131, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

139. The memory device according to claim 131, wherein said first switches are in an inactive state after data is transferred from said memory cells of said circuit units to said temporary storage cells and after data is transferred from said temporary storage cells to said memory cells of said circuit units.

140. The memory device according to claim 131, further comprising:

an input/output circuit coupled to said temporary storage cells for inputting data to and outputting data from said temporary storage cells.

141. The memory device according to claim 140, further comprising;

a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

142. The memory device according to claim 141, wherein said data transfer control circuit comprises:

circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

143. The memory device according to claim 140, further comprising:

a data transfer control circuit for controlling a transfer of data from said memory cells of said circuit units to said temporary storage cells and for controlling a transfer of data from said temporary storage cells to said memory cells of said circuit units.

144. The memory device according to claim 143, wherein said data transfer control circuit comprises:

circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

145. The memory device according to claim 140, further comprising:

a data transfer control circuit for controlling a transfer of data from said temporary storage cells to said input/output circuit and for controlling a transfer of data from said input/output circuit to said temporary storage cells.

146. The memory device according to claim 140, further comprising:

input/output data lines coupling said temporary storage cells and said input/output circuit; and second switches coupled between said temporary storage cells and said input/output data lines for transferring data between said temporary storage cells and said input/output circuit.

147. The memory device according to claim 146, wherein said second switches comprise transistors each having a first current terminal coupled to a corresponding one of said temporary storage cells, a second current terminal coupled to a corresponding one of said input/output data lines, and a control terminal.

148. The memory device according to claim 147, wherein said transistors comprise MOS transistors.

149. The memory device according to claim 146, further comprising:

a data transfer control circuit for controlling a transfer of data from said temporary storage cells to said input/output circuit via said second switches and for controlling a transfer of data from said input/output circuit to said temporary storage cells via said second switches.

150. The memory device according to claim 146, wherein said second switches are in an inactive state after data is transferred from said temporary storage cells to said input/output circuit and after data is transferred from said input/output circuit to said temporary storage cells.

151. The memory device according to claim 131, further comprising:

an input/output circuit comprising a plurality of input/output circuit sections, each input/output circuit section coupled to a corresponding one of said temporary storage cells for inputting data to and outputting data from the corresponding one of said temporary storage cells.

152. The memory device according to claim 151, further comprising:

a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

153. The memory device according to claim 152, wherein said data transfer control circuit comprises:

a circuit responsive to address data from controlling the transfer of data from said memory cells of said circuit units to said input/output circuit sections via said temporary storage cells in accordance with a predetermined sequence and for controlling the transfer of said from said input/output circuit sections to said memory cells of said circuit units via said temporary storage cells in accordance with a predetermined sequence.

154. The memory device according to claim 151, further comprising:

a data transfer control circuit for controlling a transfer of data from said memory cells of said circuit units to said temporary storage cells and for controlling a transfer of data from said temporary storage cells to said memory cells of said circuit units.

155. The memory device according to claim 154, wherein said data transfer control circuit comprises:

a circuit means responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

156. The memory device according to claim 151, further comprising:

a data transfer control circuit for controlling a transfer of data from said temporary storage cells to said input/output circuit sections and for controlling a transfer of data from said input/output circuit sections to said temporary storage cells.

157. The memory device according to claim 151, further comprising:

second switches responsive to second control signals and respectively coupled between said temporary storage cells and said input/output circuit sections for transferring data between said temporary storage cells and said input/output circuit sections.

158. The memory device according to claim 157, wherein said second switches comprise transistors each having a first current terminal coupled to a corresponding one of said input/output circuit sections, a second current terminal coupled to a corresponding one of said temporary storage cells, and a control terminal for receiving the second control signals.

159. The memory device according to claim 158, wherein said transistors comprise MOS transistors.

160. The memory device according to claim 157, further comprising:

a data transfer control circuit for controlling a transfer of data from said temporary storage cells to said input/output circuit sections via said second switches and for controlling a transfer of data from said input/output circuit sections to said temporary storage cells via said second switches.

161. The memory device according to claim 157, wherein said second switches are in an inactive state after data is transferred from said temporary storage cells to said input/output circuit sections and after data is transferred from said input/output circuit sections to said temporary storage cells.

162. A memory device, comprising:

a bit line;

at least two circuit units coupled to said bit line, each circuit unit comprising at least two memory cells connected in series;

at least two temporary storage cells;

a data line coupled to said temporary storage cells;

a data transfer circuit coupled between said bit line and said data line for transferring data from said memory cells of said circuit units to said temporary storage cells and for transferring data from said temporary storage cells to said memory cells of said circuit units; and an input/output circuit coupled to said temporary storage cells for inputting data and outputting data from said temporary storage cells.

163. The memory device according to claim 162, further comprising:

a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

164. The memory device according to claim 163, wherein said data transfer control circuit comprises:

a circuit means responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

165. The memory device according to claim 162, further comprising:

a data transfer control circuit for controlling a transfer of data from said memory cells of said circuit units to said temporary storage cells and for controlling a transfer of data from said temporary storage cells to said memory cells of said circuit units.

166. The memory device according to claim 165, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

167. The memory device according to claim 162, further comprising:

a data transfer control circuit for controlling a transfer of data from said temporary storage cells to said input/output circuit and for controlling a transfer of data from said input/output circuit to said temporary storage cells.

168. The memory device according to claim 162, further comprising:

switches respectively coupled between said temporary storage cells and said input/output circuit for transferring data between said temporary storage cells and said input/output circuit.

169. The memory device according to claim 168, wherein said switches comprise transistors.

170. The memory device according to claim 169, wherein said transistors comprise MOS transistors.

171. The memory device according to claim 168, further comprising:

a data transfer control circuit for controlling a transfer of data from said temporary storage cells to said input/output circuit via said switches and for controlling a transfer of data from said input/output circuit to said temporary storage cells via said switches.

172. The memory device according to claim 168, wherein said switches are in an inactive state after data is transferred from said temporary storage cells to said input/output circuit and after data is transferred from said input/output circuit to said temporary storage cells.

173. A memory device, comprising:
- a bit line;
- at least two circuit units coupled to said bit line, each circuit unit comprising at least two memory cells connected in series;
- at least two temporary storage cells;
- a data line coupled to said temporary storage cells;
- a data transfer circuit coupled between said bit line and said data line for transferring data from said memory cells of said circuit units to said temporary storage cells and for transferring data from said temporary storage cells to said memory cells of said circuit units; and
- an input/output circuit comprising a plurality of input/output circuit sections, each input/output circuit section coupled to a corresponding one of said temporary storage cells for inputting data to and outputting data from the corresponding one of said temporary storage cells.

174. The memory device according to claim 173, further comprising:
- a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

175. The memory device according to claim 174, wherein said data transfer control circuit comprises:
- a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

176. The memory device according to claim 173, further comprising:
- a data transfer control circuit for controlling a transfer of data from said memory cells of said circuit units to said temporary storage cells and for controlling a transfer of data from said temporary storage cells to said memory cells of said circuit units.

177. The memory device according to claim 176, wherein said data transfer control circuit comprises:
- a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

178. The memory device according to claim 173, further comprising:
- a data transfer control circuit for controlling a transfer of data from said temporary storage cells to said input/output circuit sections and for controlling a transfer of data from said input/output circuit sections to said temporary storage cells.

179. The memory device according to claim 173, further comprising:
- switches responsive to control signals and respectively coupled between said temporary storage cells and said input/output circuit sections for transferring data between said temporary storage cells and said input/output circuit sections.

180. The memory device according to claim 179, wherein said switches comprise transistors each having a first current terminal coupled to a corresponding one of said input/output circuit sections, a second current terminal coupled to a corresponding one of said temporary storage cells, and a control terminal for receiving the control signals.

181. The memory device according to claim 180, wherein said transistors comprise MOS transistors.

182. The memory device according to claim 179, further comprising:
- a data transfer control circuit for controlling a transfer of data from said temporary storage cells to said input/output circuit sections via said switches and for controlling a transfer of data from said input/output circuit sections to said temporary storage cells via said switches.

183. The memory device according to claim 179, wherein said switches are in an inactive state after data is transferred from said temporary storage cells to said input/output circuit sections and after data is transferred from said input/output circuit sections to said temporary storage cells.

184. A memory device, comprising:
- a bit line;
- at least two circuit units coupled to said bit line, each circuit unit comprising at least two reprogrammable memory cells connected in series;
- at least two temporary storage cells coupled to said bit line; and
- first switches, responsive to first control signals and each coupled between said bit line and a corresponding one of said temporary cells for transferring data between said bit line and said temporary storage cells.

185. The memory device according to claim 184, wherein said first switches comprise first transistors each having a first current terminal coupled to said bit line, a second current terminal coupled to the corresponding one of said temporary storage cells, and a control terminal for receiving the first control signals.

186. The memory device according to claim 185, wherein said first transistors comprise MOS transistors.

187. The memory device according to claim 184, further comprising:
- a selector circuit for generating the first control signals in response to address data.

188. The memory device according to claim 184, further comprising:
- a data transfer control circuit for controlling a transfer of data from said memory cells of said circuit units to said temporary storage cells via said first switches and for controlling a transfer of data from said temporary storage cells to said memory cells of said circuit units via said first switches.

189. The memory device according to claim 188, wherein said data transfer control circuit comprises:
- a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

190. The memory device according to claim 184, wherein said first switches are in an inactive state after data is transferred from said memory cells of said circuit units to said temporary storage cells and after data is transferred from said temporary storage cells to said memory cells of said circuit units.

191. The memory device according to claim 184, further comprising:
an input/output circuit coupled to said temporary storage cells for inputting data to and outputting data from said temporary storage cells.

192. The memory device according to claim 191, further comprising:
a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

193. The memory device according to claim 192, wherein said data transfer control circuit comprises:
a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

194. The memory device according to claim 191, further comprising:
a data transfer control circuit for controlling a transfer of data from said memory cells of said circuit units to said temporary storage cells and for controlling a transfer of data from said temporary storage cells to said memory cells of said circuit units.

195. The memory device according to claim 194, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

196. The memory device according to claim 191, further comprising:
a data transfer control circuit for controlling a transfer of data from said temporary storage cells to said input/output circuit and for controlling a transfer of data from said input/output circuit to said temporary storage cells.

197. The memory device according to claim 191, further comprising:
second switches coupled between said temporary storage cells and said input/output circuit for transferring data between said temporary storage cells and said input/output circuit.

198. The memory device according to claim 197, wherein said second switches comprise transistors each having a first current terminal coupled to a corresponding one of said temporary storage cells, a second current terminal coupled to said input/output circuit, and a control terminal.

199. The memory device according to claim 198, wherein said transistors comprise MOS transistors.

200. The memory device according to claim 197, further comprising:
a data transfer control circuit for controlling a transfer of data from said temporary storage cells to said input/output circuit via said second switches and for controlling a transfer of data from said input/output circuit to said temporary storage cells via said second switches.

201. The memory device according to claim 197, wherein said second switches are in an inactive state after data is transferred from said temporary storage cells to said input/output circuit and after data is transferred from said input/output circuit to said temporary storage cells.

202. The memory device according to claim 185, further comprising:
an input/output circuit comprising a plurality of input/output circuit sections, each input/output circuit section coupled to a corresponding one of said temporary storage cells for inputting data to and outputting data from the corresponding one of said temporary storage cells.

203. The memory device according to claim 202, further comprising:
a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

204. The memory device according to claim 203, wherein said data transfer control circuit comprises:
a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

205. The memory device according to claim 202, further comprising:
a data transfer control circuit for controlling a transfer of data from said memory cells of said circuit units to said temporary storage cells and for controlling a transfer of data from said temporary storage cells to said memory cells of said circuit units.

206. The memory device according to claim 205, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

207. The memory device according to claim 202, further comprising:
a data transfer control circuit for controlling a transfer of data from said temporary storage cells to said input/output circuit sections and for controlling a transfer of data from said input/output circuit sections to said temporary storage cells.

208. The memory device according to claim 202, further comprising:
second switches responsive to second control signals and coupled between said temporary storage cells and said input/output circuit sections for transferring data between said temporary storage cells and said input/output circuit sections.

209. The memory device according to claim 208, wherein said second switches comprise transistors each having a first current terminal coupled to a corresponding one of said input/output circuit sections, a second current terminal coupled to a corresponding one of said temporary storage cells, and a control terminal for receiving the second control signals.

210. The memory device according to claim 209, wherein said transistors comprise MOS transistors.

211. The memory device according to claim 208, further comprising:
a data transfer control circuit for controlling a transfer of data from said temporary storage cells to said input/output circuit sections via said second switches and for controlling a transfer of data from said input/output circuit sections to said temporary storage cells via said second switches.

212. The memory device according to claim 208, wherein said second switches are in an inactive state after data is transferred from said temporary storage cells to said input/output circuit sections and after data is transferred from said input/output circuit sections to said temporary storage cells.

213. A memory device, comprising:
a bit line;
at least two circuit units coupled to said bit line, each circuit unit comprising at least two memory cells connected in series;
at least two temporary storage cells coupled to said bit line; and
an input/output circuit coupled to said temporary storage cells for inputting data to and outputting data from said temporary storage cells.

214. The memory device according to claim 213, further comprising:
a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

215. The memory device according to claim 214, wherein said data transfer control circuit comprises:
a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

216. The memory device according to claim 213, further comprising:
a data transfer control circuit for controlling a transfer of data from said memory cells of said circuit units to said temporary storage cells and for controlling a transfer of data from said temporary storage cells to said memory cells of said circuit units.

217. The memory device according to claim 216, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

218. The memory device according to claim 213, further comprising:
a data transfer control circuit for controlling a transfer of data from said temporary storage cells to said input/output circuit and for controlling a transfer of data from said input/output circuit to said temporary storage cells.

219. The memory device according to claim 213, further comprising:
switches coupled between said temporary storage cells and said input/output circuit for transferring data between said temporary storage cells and said input/output circuit.

220. The memory device according to claim 219, wherein said switches comprise transistors.

221. The memory device according to claim 220, wherein said transistors comprise MOS transistors.

222. The memory device according to claim 219, further comprising:
a data transfer control circuit for controlling a transfer of data from said temporary storage cells to said input/output circuit via said switches and for controlling a transfer of data from said input/output circuit to said temporary storage cells via said switches.

223. The memory device according to claim 219, wherein said switches are in an inactive state after data is transferred from said temporary storage cells to said input/output circuit and after data is transferred from said input/output circuit to said temporary storage cells.

224. A memory device, comprising:
a bit line;
at least two circuit units coupled to said bit line, each circuit unit comprising at least two memory cells connected in series;
at least two temporary storage cells coupled to said bit line; and
an input/output circuit comprising a plurality of input/output circuit sections, each input/output circuit section coupled to a corresponding one of said temporary storage cells for inputting data to and outputting data from the corresponding one of said temporary storage cells.

225. The memory device according to claim 224, further comprising:
a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

226. The memory device according to claim 225, wherein said data transfer control circuit comprises:
a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

227. The memory device according to claim 224, further comprising:
a data transfer control circuit for controlling a transfer of data from said memory cells of said circuit units to said temporary storage cells and for controlling a transfer of data from said temporary storage cells to said memory cells of said circuit units.

228. The memory device according to claim 227, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

229. The memory device according to claim 224, further comprising:

a data transfer control circuit for controlling a transfer of data from said temporary storage cells to said input/output circuit sections and for controlling a transfer of data from said input/output circuit sections to said temporary storage cells.

230. The memory device according to claim 224, further comprising:

switches responsive to control signals and coupled between said temporary storage cells and said input/output circuit sections for transferring data between said temporary storage cells and said input/output circuit sections.

231. The memory device according to claim 230, wherein said switches comprise transistors each having a first current terminal coupled to a corresponding one of said input/output circuit sections, a second current terminal coupled to a corresponding one of said temporary storage cells, and a control terminal for receiving the control signals.

232. The memory device according to claim 231, wherein said transistors comprise MOS transistors.

233. The memory device according to claim 230, further comprising:

a data transfer control circuit for controlling a transfer of data from said temporary storage cells to said input/output circuit sections via said switches and for controlling a transfer of data from said input/output circuit sections to said temporary storage cells via said switches.

234. The memory device according to claim 230, wherein said switches are in an inactive state after data is transferred from said temporary storage cells to said input/output circuit sections and after data is transferred from said input/output circuit sections to said temporary storage cells.

235. A memory device, comprising:

a plurality of circuit units disposed in a first row and column matrix, each circuit unit comprising at least two memory cells connected in series;

a plurality of temporary storage cells disposed in a second row and column matrix; and a plurality of bit lines, each bit line coupling the temporary storage cells in a given column of said second matrix with the circuit units in a given column of said first matrix.

236. The memory device according to claim 235, further comprising:

a data transfer control circuit for controlling a transfer of data from said memory cells of said circuit units to said temporary storage cells and for controlling a transfer of data from said temporary storage cells to said memory cells of said circuit units.

237. The memory device according to claim 236, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

238. The memory device according to claim 235, wherein a number of memory cells in each of said circuit units is equal to a number of temporary storage cells coupled to each bit line.

239. A memory device, comprising:

a plurality of circuit units disposed in a first row and column matrix, each circuit unit comprising at least two memory cells connected in series;

a plurality of temporary storage cells disposed in a second row and column matrix;

a plurality of bit lines, each bit line coupled to the circuit units in a given column of said first matrix;

a plurality of first data lines, each first data line coupled to the temporary storage cells in a given column of said second matrix; and a plurality of data transfer circuits, each coupled between one of said bit lines and one of said first data lines, for transferring data from said memory cells of said circuit units to said temporary storage cells and for transferring data from said temporary storage cells to said memory cells of said circuit units.

240. The memory device according to claim 239, wherein said data transfer circuits comprise transistors.

241. The memory device according to claim 240, wherein said transistors comprise MOS transistors.

242. The memory device according to claim 239, further comprising:

a data transfer control circuit for controlling the transfer of data from said memory cells of said circuit units to said temporary storage cells via said data transfer circuits and for controlling the transfer of data from said temporary storage cells to said memory cells of said circuit units via said data transfer circuits.

243. The memory device according to claim 242, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

244. The memory device according to claim 239, wherein said data transfer circuits are in an inactive state after data is transferred from said memory cells of said circuit units to said temporary storage cells and after data is transferred from said temporary storage cells to said memory cells of said circuit units.

245. A memory device, comprising:

a plurality of circuit units disposed in a first row and column matrix, each circuit unit comprising at least two memory cells connected in series;

a plurality of temporary storage cells disposed in a second row and column matrix;

a plurality of bit lines, each bit line coupled to the circuit units in a given column of said first matrix;

a plurality of first data lines, each first data line coupled to said temporary storage cells in a given column of said second matrix;

a plurality of data transfer circuits, each coupled between one of said bit lines and one of said first data lines, for transferring data from said memory cells of said circuit units to said temporary storage cells and for transferring data from said temporary storage cells to said memory cells of said circuit units; and first switches, responsive to first control signals and each coupled between one of said first data lines and one of said temporary cells, for transferring data between said first data lines and said temporary storage cells.

246. The memory device according to claim 245, wherein said first switches comprise first transistors each having a first current terminal coupled to the corresponding one of said first data lines, a second current terminal coupled to the corresponding one of said temporary storage cells, and a control terminal for receiving the first control signals.

247. The memory device according to claim 246, wherein said first transistors comprise MOS transistors.

248. The memory device according to claim 245, further comprising:
a selector circuit for generating the first control signals in response to address data.

249. The memory device according to claim 248, wherein said selector circuit comprises a plurality of partial selectors.

250. The memory device according to claim 249, wherein said partial selectors each comprise:
first transistors each having a first current terminal coupled to a power supply voltage, a second current terminal coupled to a common node, and a control terminal receiving the address data;
second transistors connected in series between said common node and a reference potential, each of said second transistors having a control terminal receiving the address data; and
an inverter having an input terminal coupled to said common node and an output terminal for outputting first control signals.

251. The memory device according to claim 245, further comprising:
a data transfer control circuit for controlling the transfer of data from said memory cells of said circuit units to said temporary storage cells via said first switches and for controlling the transfer of data from said temporary storage cells to said memory cells of said circuit units via said first switches.

252. The memory device according to claim 251, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

253. The memory device according to claim 245, wherein said first switches are in an inactive state after data is transferred from said memory cells of said circuit units to said temporary storage cells and after data is transferred from said temporary storage cells to said memory cells of said circuit units.

254. The memory device according to claim 245, further comprising:
an input/output circuit coupled to said temporary storage cells for inputting data to and outputting data from said temporary storage cells.

255. The memory device according to claim 254, further comprising:
a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

256. The memory device according to claim 255, wherein said data transfer control circuit comprises:
a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

257. The memory device according to claim 254, further comprising:
a data transfer control circuit for controlling a transfer of data from said memory cells of said circuit units to said temporary storage cells and for controlling a transfer of data from said temporary storage cells to said memory cells of said circuit units.

258. The memory device according to claim 257, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

259. The memory device according to claim 254, further comprising:
a data transfer control circuit for controlling a transfer of data from said temporary storage cells to said input/output circuit and for controlling a transfer of data from said input/output circuit to said temporary storage cells.

260. The memory device according to claim 254, further comprising:
second switches coupled between said temporary storage cells and said input/output circuit for transferring data between said temporary storage cells and said input/output circuit.

261. The memory device according to claim 260, wherein said second switches comprise transistors each having a first current terminal coupled to one of said temporary storage cells, a second current terminal coupled to said input/output circuit, and a control terminal.

262. The memory device according to claim 261, wherein said transistors comprise MOS transistors.

263. The memory device according to claim 260, further comprising:
a data transfer control circuit for controlling a transfer of data from said temporary storage cells to said input/output circuit via said second switches and for controlling a transfer of data from said input/output circuit to said temporary storage cells via said second switches.

264. The memory device according to claim 260, wherein said second switches are in an inactive state after data is transferred from said temporary storage cells to said input/output circuit and after data is transferred from said input/output circuit to said temporary storage cells.

265. The memory device according to claim 245, further comprising:
a plurality of second data lines, each second line coupled to the temporary storage cells in a given row of said second matrix; and an input/output circuit comprising a plurality of input/output circuit sections, each input/output circuit section coupled to a corresponding one of said second data lines for inputting data to and outputting data from said temporary storage cells.

266. The memory device according to claim 265, further comprising:

a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

267. The memory device according to claim 266, wherein said data transfer control circuit comprises:

a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

268. The memory device according to claim 265, further comprising:

a data transfer control circuit for controlling a transfer of data from said memory cells of said circuit units to said temporary storage cells and for controlling a transfer of data from said temporary storage cells to said memory cells of said circuit units.

269. The memory device according to claim 268, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

270. The memory device according to claim 265, further comprising:

a data transfer control circuit for controlling a transfer of data from said temporary storage cells to said input/output circuit sections and for controlling a transfer of data from said input/output circuit sections to said temporary storage cells.

271. The memory device according to claim 265, further comprising:

second switches responsive to second control signals and coupled between said second data lines and said input/output circuit sections for transferring data between said temporary storage cells and said input/output circuit sections.

272. The memory device according to claim 271, wherein said second switches comprise transistors each having a first terminal coupled to a corresponding one of said input/output circuit sections, a second current terminal coupled to a corresponding one of said second data lines, and a control terminal for receiving the second control signals.

273. The memory device according to claim 272, wherein said transistors comprise MOS transistors.

274. The memory device according to claim 271, further comprising:

a data transfer control circuit for controlling a transfer of data from said temporary storage cells to said input/output circuit sections via said second switches and for controlling a transfer of data from said input/output circuit sections to said temporary storage cells via said second switches.

275. The memory device according to claim 271, wherein said second switches are in an inactive state after data is transferred from said temporary storage cells to said input/output circuit sections and after data is transferred from said input/output circuit sections to said temporary storage cells.

276. A memory device, comprising:

a plurality of circuit units disposed in a first row and column matrix, each circuit unit comprising at least two memory cells connected in series;

a plurality of temporary storage cells disposed in a second row and column matrix;

a plurality of bit lines, each bit line coupled to the circuit units in a given column of said first matrix;

a plurality of first data lines, each first data line coupled to the temporary storage cells in a given column of said second matrix;

a plurality of data transfer circuits, each coupled between one of said bit lines and one of said first data lines, for transferring data from said memory cells of said circuit units to said temporary storage cells and for transferring data from said temporary storage cells to said memory cells of said circuit units; and an input/output circuit coupled to said temporary storage cells for inputting data to and outputting data from said temporary storage cells.

277. The memory device according to claim 276, further comprising:

a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

278. The memory device according to claim 277, wherein said data transfer control circuit comprises:

a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

279. The memory device according to claim 276, further comprising:

a data transfer control circuit for controlling a transfer of data from said memory cells of said circuit units to said temporary storage cells and for controlling a transfer of data from said temporary storage cells to said memory cells of said circuit units.

280. The memory device according to claim 279, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

281. The memory device according to claim 276, further comprising:

a data transfer control circuit for controlling a transfer of data from said temporary storage cells to said input/ output circuit and for controlling a transfer of data from said input/output circuit to said temporary storage cells.

282. The memory device according to claim 276, further comprising:

switches coupled between said temporary storage cells and said input/output circuit for transferring data between said temporary storage cells and said input/output circuit.

283. The memory device according to claim 282, wherein said switches comprise transistors.

284. The memory device according to claim 283, wherein said transistors comprise MOS transistors.

285. The memory device according to claim 282, further comprising:

a data transfer control circuit for controlling a transfer of data from said temporary storage cells to said input/output circuit via said switches and for controlling a transfer of data from said input/output circuit to said temporary storage cells via said switches.

286. The memory device according to claim 282, wherein said switches are in an inactive state after data is transferred from said temporary storage cells to said input/output circuit and after data is transferred from said input/output circuit to said temporary storage cells.

287. A memory device, comprising:

a plurality of circuit units disposed in a first row and column matrix, each circuit unit comprising at least two memory cells connected in series;

a plurality of temporary storage cells disposed in a second row and column matrix;

a plurality of bit lines, each bit line coupled to the circuit units in a given column of said first matrix;

a plurality of first data lines, each first data line coupled to the temporary storage cells in a given column of said second matrix;

a plurality of data transfer circuits, each coupled between one of said bit lines and one of said first data lines, for transferring data from said memory cells of said circuit units to said temporary storage cells and for transferring data from said temporary storage cells to said memory cells of said circuit units;

a plurality of second data lines, each second data line coupled to said temporary storage cells in a given row of said second matrix; and an input/output circuit comprising a plurality of input/output circuit sections, each input/output circuit section coupled to a corresponding one of said second data lines for inputting data and outputting data from said temporary storage cells.

288. The memory device according to claim 287, further comprising:

a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

289. The memory device according to claim 288, wherein said data transfer control circuit comprises:

a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

290. The memory device according to claim 287, further comprising:

a data transfer control circuit for controlling a transfer of data from said memory cells of said circuit units to said temporary storage cells and for controlling a transfer of data from said temporary storage cells to said memory cells of said circuit units.

291. The memory device according to claim 290, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

292. The memory device according to claim 287, further comprising:

a data transfer control circuit for controlling a transfer of data from said temporary storage cells to said input/output circuit sections and for controlling a transfer of data from said input/output circuit sections to said temporary storage cells.

293. The memory device according to claim 287, further comprising:

switches responsive to control signals and coupled between said temporary storage cells and said input/output circuit sections for transferring data between said temporary storage cells and said input/output circuit sections.

294. The memory device according to claim 293, wherein said switches comprise transistors each having a first current terminal coupled to a corresponding one of said input/output circuit sections, a second current terminal coupled to a corresponding one of said temporary storage cells, and a control terminal for receiving the control signals.

295. The memory device according to claim 294, wherein said transistors comprise MOS transistors.

296. The memory device according to claim 293, further comprising:

a data transfer control circuit for controlling a transfer of data from said temporary storage cells to said input/output circuit sections via said switches and for controlling a transfer of data from said input/output circuit sections to said temporary storage cells via said switches.

297. The memory device according to claim 293, wherein said switches are in an inactive state after data is transferred from said temporary storage cells to said input/output circuit sections and after data is transferred from said input/output circuit sections to said temporary storage cells.

298. A memory device, comprising:

a plurality of circuit units disposed in a first row and column matrix, each circuit unit comprising at least two reprogrammable memory cells connected in series;

a plurality of temporary storage cells disposed in a second row and column matrix;

a plurality of bit lines, each bit line coupling the temporary storage cells in a given column of said second matrix with the circuit units in a given column of said first matrix; and first switches, responsive to first control signals and each coupled between one of said bit lines and one of said temporary cells, for transferring data between said bit lines and said temporary storage cells.

299. The memory device according to claim 298, wherein said first switches comprise first transistors each having a first current terminal coupled to the corresponding one of said bit lines, a second current terminal coupled to the corresponding one of said temporary storage cells, and a control terminal for receiving the first control signals.

300. The memory device according to claim 299, wherein said first transistors comprise MOS transistors.

301. The memory device according to claim 298, further comprising:
- a selector circuit for generating the first control signals in response to address data.

302. The memory device according to claim 298, further comprising:
- a data transfer control circuit for controlling a transfer of data from said memory cells of said circuit units to said temporary storage cells via said first switches and for controlling a transfer of data from said temporary storage cells to said memory cells of said circuit units via said first switches.

303. The memory device according to claim 302, wherein said data transfer control circuit comprises:
- a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

304. The memory device according to claim 298, wherein said first switches are in an inactive state after data is transferred from said memory cells of said circuit units to said temporary storage cells and after data is transferred from said temporary storage cells to said memory cells of said circuit units.

305. The memory device according to claim 298, further comprising:
- an input/output circuit coupled to said temporary storage cells for inputting data to and outputting data from said temporary storage cells.

306. The memory device according to claim 305, further comprising:
- a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

307. The memory device according to claim 306, wherein said data transfer control circuit comprises:
- a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

308. The memory device according to claim 305, further comprising:
- a data transfer control circuit for controlling a transfer of data from said memory cells of said circuit units to said temporary storage cells and for controlling a transfer of data from said temporary storage cells to said memory cells of said circuit units.

309. The memory device according to claim 308, wherein said data transfer control circuit comprises:
- a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

310. The memory device according to claim 305, further comprising:
- a data transfer control circuit for controlling a transfer of data from said temporary storage cells to said input/output circuit and for controlling a transfer of data from said input/output circuit to said temporary storage cells.

311. The memory device according to claim 305, further comprising:
- second switches coupled between said temporary storage cells and said input/output circuit for transferring data between said temporary storage cells and said input/output circuit.

312. The memory device according to claim 311, wherein said second switches comprise transistors each having a first current terminal coupled to one of said temporary storage cells, a second current terminal coupled to said input/output circuit, and a control terminal.

313. The memory device according to claim 312, wherein said transistors comprise MOS transistors.

314. The memory device according to claim 311, further comprising:
- a data transfer control circuit for controlling a transfer of data from said temporary storage cells to said input/output circuit via said second switches and for controlling a transfer of data from said input/output circuit to said temporary storage cells via said second switches.

315. The memory device according to claim 311, wherein said second switches are in an inactive state after data is transferred from said temporary storage cells to said input/output circuit and after data is transferred from said input/output circuit to said temporary storage cells.

316. The memory device according to claim 298, further comprising:
- a plurality of second data lines, each second data line coupled to said temporary storage cells in a given row of said second matrix; and
- an input/output circuit comprising a plurality of input/output circuit sections, each input/output circuit section coupled to a corresponding one of said second data lines for inputting data to and outputting data from said temporary storage cells.

317. The memory device according to claim 316, further comprising:
- a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

318. The memory device according to claim 317, wherein said data transfer control circuit comprises:
- a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

319. The memory device according to claim 316, further comprising:
a data transfer control circuit for controlling a transfer of data from said memory cells of said circuit units to said temporary storage cells and for controlling a transfer of data from said temporary storage cells to said memory cells of said circuit units.

320. The memory device according to claim 319, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

321. The memory device according to claim 316, further comprising:
a data transfer control circuit for controlling a transfer of data from said temporary storage cells to said input/output circuit sections and for controlling a transfer of data from said input/output circuit sections to said temporary storage cells.

322. The memory device according to claim 316, further comprising:
second switches responsive to second control signals and coupled between said second data lines and said input/output circuit sections for transferring data between said temporary storage cells and said input/output circuit sections.

323. The memory device according to claim 322, wherein said second switches comprise transistors each having a first current terminal coupled to a corresponding one of said input/output circuit sections, a second current terminal coupled to a corresponding one of said second data lines, and a control terminal for receiving the second control signals.

324. The memory device according to claim 323, wherein said transistors comprise MOS transistors.

325. The memory device according to claim 322, further comprising:
a data transfer control circuit for controlling a transfer of data from said temporary storage cells to said input/output circuit sections via said second switches and for controlling a transfer of data from said input/output circuit sections to said temporary storage cells via said second switches.

326. The memory device according to claim 322, wherein said second switches are in an inactive state after data is transferred from said temporary storage cells to said input/output circuit sections and after data is transferred from said input/output circuit sections to said temporary storage cells.

327. A memory device, comprising:
a plurality of circuit units disposed in a first row and column matrix, each circuit unit comprising at least two memory cells connected in series;
a plurality of temporary storage cells disposed in a second row and column matrix;
a plurality of bit lines, each bit line coupling the temporary storage cells in a given column of said second matrix with the circuit units in a given column of said first matrix; and
an input/output circuit coupled to said temporary storage cells for inputting data to and outputting data from said temporary storage cells.

328. The memory device according to claim 327, further comprising:
a data transfer control circuit for controlling a transfer of data from said memory cells of said circuit units to said input/output circuit via said temporary storage cells and for controlling a transfer of data from said input/output circuit to said memory cells of said circuit units via said temporary storage cells.

329. The memory device according to claim 228, wherein said data transfer control circuit comprises:
a circuit responsive to address data for controlling the transfer of data from said memory cells of said circuit units to said input/output circuit via said temporary storage cells in accordance with a predetermined sequence and for controlling the transfer of data from said input/output circuit to said memory cells of said circuit units via said temporary storage cells in accordance with a predetermined sequence.

330. The memory device according to claim 327, further comprising:
a data transfer control circuit for controlling a transfer of data from said memory cells of said circuit units to said temporary storage cells and for controlling a transfer of data from said temporary storage cells to said memory cells of said circuit units.

331. The memory device according to claim 330, wherein said data transfer control circuit comprises:
a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

332. The memory device according to claim 327, further comprising:
a data transfer control circuit for controlling a transfer of data from said temporary storage cells to said input/output circuit and for controlling a transfer of data from said input/output circuit to said temporary storage cells.

333. The memory device according to claim 327, further comprising:
switches coupled between said temporary storage cells and said input/output circuit for transferring data between said temporary storage cells and said input/output circuit.

334. The memory device according to claim 333, wherein said switches comprise transistors.

335. The memory device according to claim 334, wherein said transistors comprise MOS transistors.

336. The memory device according to claim 333, further comprising:
a data transfer control circuit for controlling a transfer of data from said temporary storage cells to said input/output circuit via said switches and for controlling a transfer of data from said input/output circuit to said temporary storage cells via said switches.

337. The memory device according to claim 333, wherein said switches are in an inactive state after data is transferred from said temporary storage cells to said input/output circuit and after data is transferred from said input/output circuit to said temporary storage cells.

338. A memory device, comprising:
a plurality of circuit units disposed in a first row and column matrix, each circuit unit comprising at least two memory cells connected in series;
a plurality of temporary storage cells disposed in a second row and column matrix;

a plurality of bit lines, each bit line coupling the temporary storage cells in a given column of said second matrix with the circuit units in a given column of said first matrix;

a plurality of data lines, each data line coupled to the temporary storage cells in a given row of said second matrix; and an input/output circuit comprising s plurality of input/output circuit sections, each input/output circuit section coupled to a corresponding one of said data lines for inputting data to and outputting data from said temporary storage cells.

339. The memory device according to claim 338, further comprising:

a data transfer control circuit for controlling a transfer of data from said memory cells of said circuit units to said input/output circuit sections via said temporary storage cells and for controlling a transfer of data from said input/output circuit sections to said memory cells of said circuit units via said temporary storage cells.

340. The memory device according to claim 339, wherein said data transfer control circuit comprises:

a circuit responsive to address data for controlling the transfer of data from said memory cells of said circuit units to said input/output circuit sections via said temporary storage cells in accordance with a predetermined sequence and for controlling the transfer of data from said input/output circuit sections to said memory cells of said circuit units via said temporary storage cells in accordance with a predetermined sequence.

341. The memory device according to claim 338, further comprising:

a data transfer control circuit for controlling a transfer of data from said memory cells of said circuit units to said temporary storage cells and for controlling a transfer of data from said temporary storage cells to said memory cells of said circuit units.

342. The memory device according to claim 341, wherein said data transfer control circuit comprises:

a circuit responsive to address data for controlling the transfer of data from said memory cells of said circuit units to said temporary storage cells in accordance with a predetermined sequence and for controlling the transfer of data from said temporary storage cells to said memory cells of said circuit units in accordance with a predetermined sequence.

343. The memory device according to claim 338, further comprising:

a data transfer control circuit for controlling a transfer of data from said temporary storage cells to said input/output circuit sections and for controlling a transfer of data from said input/output circuit sections to said temporary storage cells.

344. The memory device according to claim 338, further comprising:

switches responsive to control signals and coupled between said temporary storage cells and said input/output circuit sections for transferring data between said temporary storage cells and said input/output circuit sections.

345. The memory device according to claim 344, wherein said switches comprise transistors each having a first current terminal coupled to a corresponding one of said input/output circuit sections, a second current terminal coupled to a corresponding one of said temporary storage cells, and a control terminal for receiving the control signals.

346. The memory device according to claim 345, wherein said transistors comprise MOS transistors.

347. The memory device according to claim 344, further comprising:

a data transfer control circuit for controlling a transfer of data from said temporary storage cells to said input/output circuit sections via said switches and for controlling a transfer of data from said input/output circuit sections to said temporary storage cells via said switches.

348. The memory device according to claim 344, wherein said switches are in an inactive state after data is transferred from said temporary storage cells to said input/output circuit sections and after data is transferred from said input/output circuit sections to said temporary storage cells.

* * * * *

UNITED STATES PATENT AND TRADEMARK OFFICE
CERTIFICATE OF CORRECTION

PATENT NO. : 5,812,453
DATED : September 22, 1998
INVENTOR(S) : FUJIO MASUOKA

It is certified that error appears in the above-identified patent and that said Letters Patent is hereby corrected as shown below:

Title page, name of inventor should be changed to --Fujio Masuoka--.

Column 13, line 9, Claim 18, before "circuit" insert --a--;
line 36, Claim 22, before "circuit" insert --a--;
line 51, Claim 24, delete "claim 22" and insert --claim 23--; and
line 53, Claim 24, before "circuit" insert --a--.

Column 14, line 11, Claim 27, delete "respective" and insert --corresponding--; and
line 24, Claim 30, before "circuit" insert --a--.

Column 15, line 3, Claim 36, before "circuit" insert --a--.

Column 16, line 7, Claim 46, before "circuit" insert --a--;
line 24, Claim 48, before "circuit" insert --a-- and
line 56, Claim 54, before "circuit" insert --a--.

Column 18, line 31, Claim 68, delete "celss" and insert --cells--.

Column 20, line 41, Claim 90, before "circuit" insert --a--.

Column 26, line 8, Claim 144, before "circuit" insert --a--.

UNITED STATES PATENT AND TRADEMARK OFFICE
CERTIFICATE OF CORRECTION

PATENT NO. : 5,812,453
DATED : September 22, 1998
INVENTOR(S) : FUJIO MASUOKA

It is certified that error appears in the above-identified patent and that said Letters Patent is hereby corrected as shown below:

Column 32, line 11, Claim 202, delete "claim 185" and insert --claim 184--.

Column 47, line 8, Claim 338, delete "s" and insert --a--.

Signed and Sealed this

Second Day of February, 1999

Attest:

Attesting Officer

*Acting Commissioner of Patents and Trademarks*